(12) United States Patent
Ono et al.

(10) Patent No.: US 6,262,452 B1
(45) Date of Patent: Jul. 17, 2001

(54) NONVOLATILE SEMICONDUCTOR MEMORY DEVICE AND MANUFACTURING METHOD THEREFOR

(75) Inventors: Masahiro Ono; Takashige Ogata; Toshiharu Oya; Masurao Yoshii, all of Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/160,134

(22) Filed: Sep. 25, 1998

(30) Foreign Application Priority Data

Sep. 26, 1997 (JP) .................................. 9-262162
Sep. 26, 1997 (JP) .................................. 9-262163
Sep. 26, 1997 (JP) .................................. 9-262166
Jan. 23, 1998 (JP) .................................. 10-011323

(51) Int. Cl.$^7$ ................................................ H01L 29/788
(52) U.S. Cl. ............................................ 257/316; 257/647
(58) Field of Search ...................................... 257/316, 317, 257/647

(56) References Cited

U.S. PATENT DOCUMENTS

| 5,095,344 | * | 3/1992 | Harari ................................ 257/327 |
| 5,488,244 | * | 1/1996 | Quek et al. ......................... 257/316 |
| 5,502,321 | * | 3/1996 | Matsushita ......................... 257/317 |
| 5,583,811 | * | 12/1996 | Van Houdt et al. ............. 365/185.15 |
| 5,889,305 | * | 3/1999 | Choi et al. ......................... 257/316 |

* cited by examiner

*Primary Examiner*—Sara Crane
(74) *Attorney, Agent, or Firm*—Armstrong Westerman Hattori McLeland & Naughton, LLP

(57) ABSTRACT

It is an object to increase the number of rewriting timing permitted for a split-gate-type nonvolatile semiconductor memory device. Ends S of floating gate 4 are disposed in inclined portions of LOCOS oxide films 2A and 2B so as to sharpen projections of the floating gate to have an angle B.

6 Claims, 28 Drawing Sheets

Fig.7A
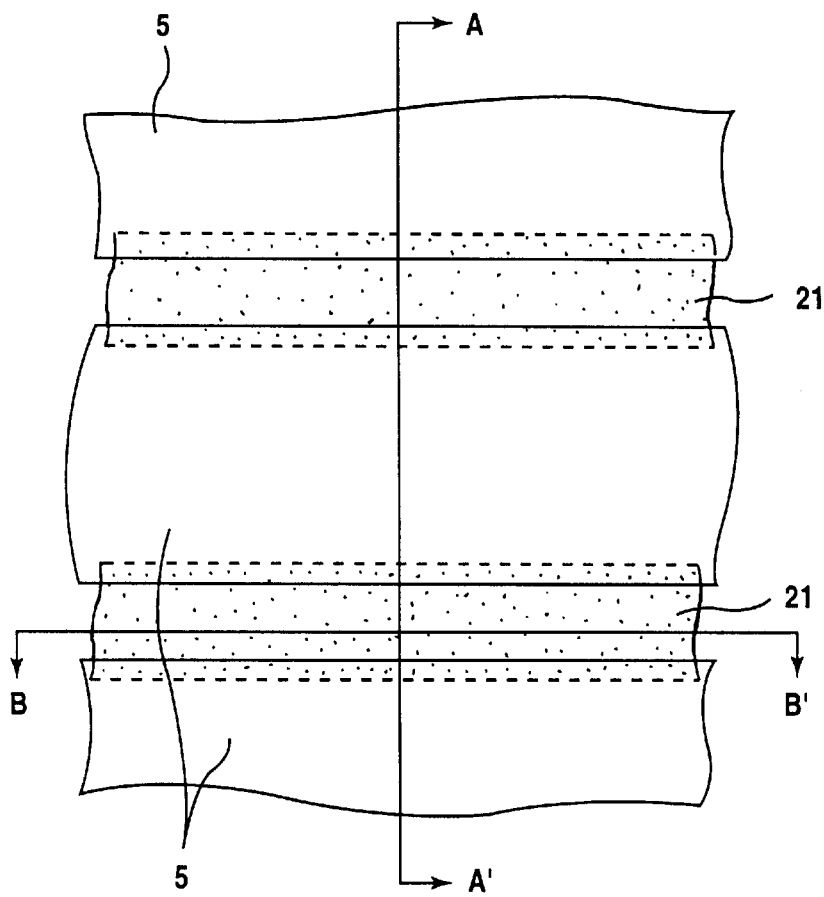
Fig.7B
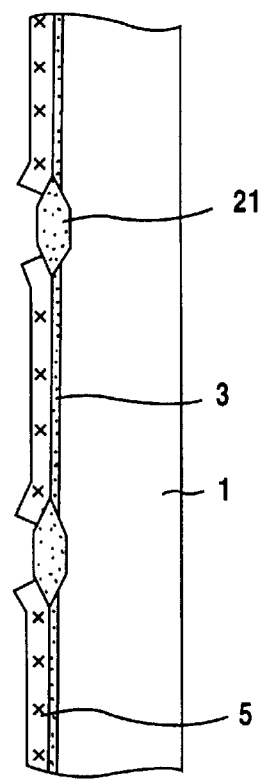
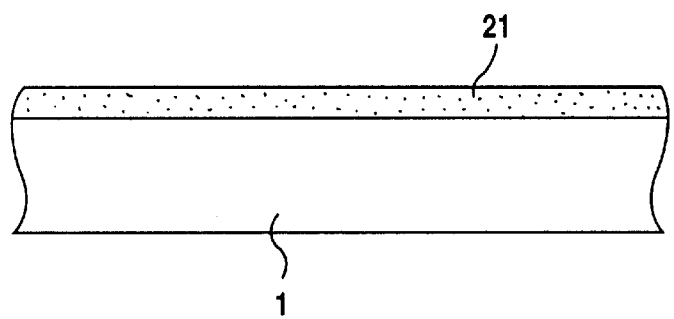
Fig.7C

Fig.9A
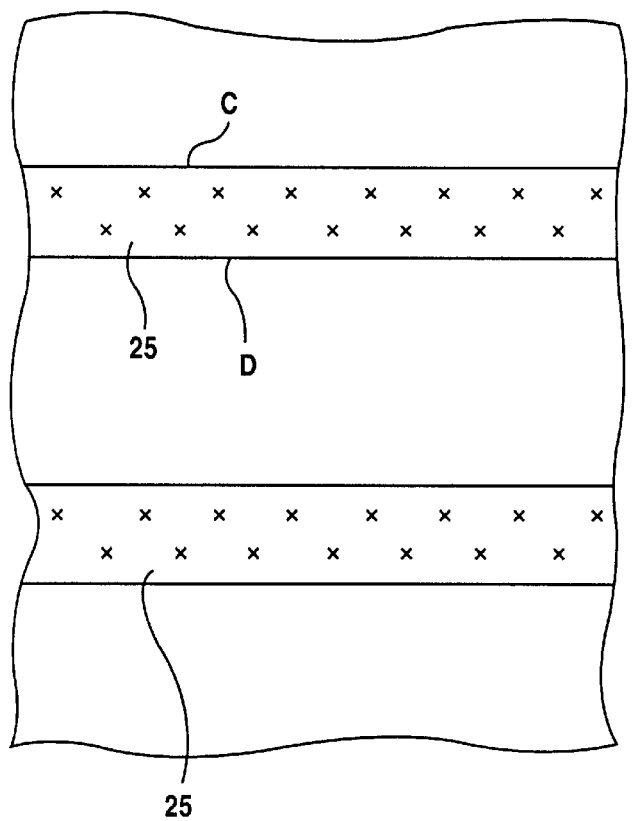
Fig.9B
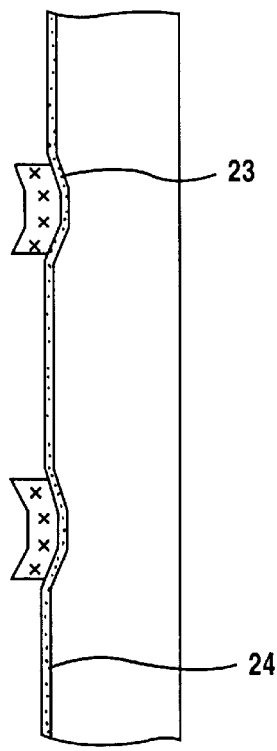
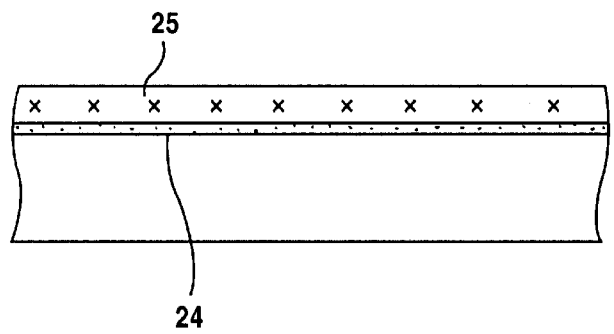
Fig.9C

Fig.10A
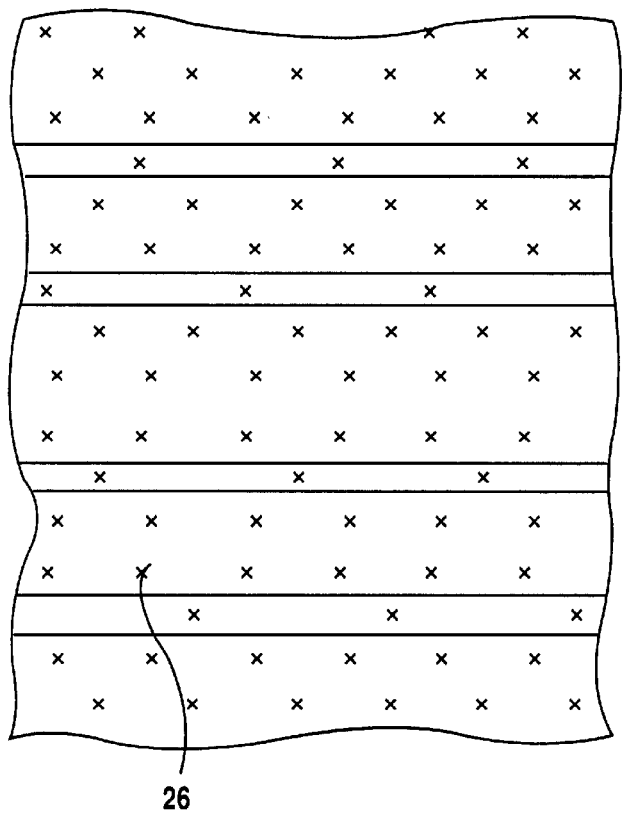
26
Fig.10B
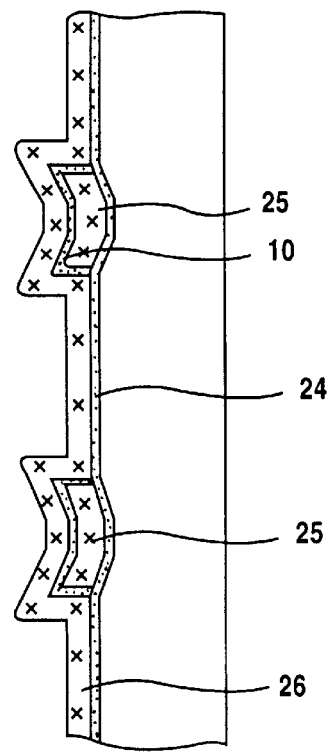
25
10
24
25
26
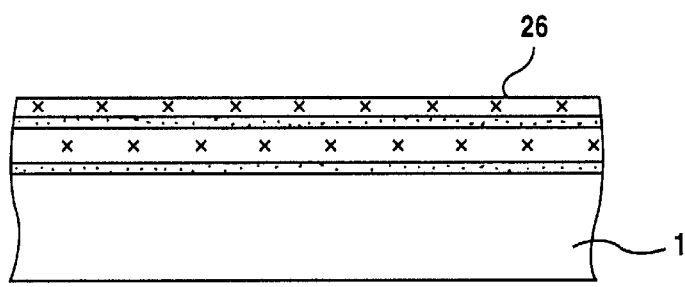
26
Fig.10C
1

Fig.12A
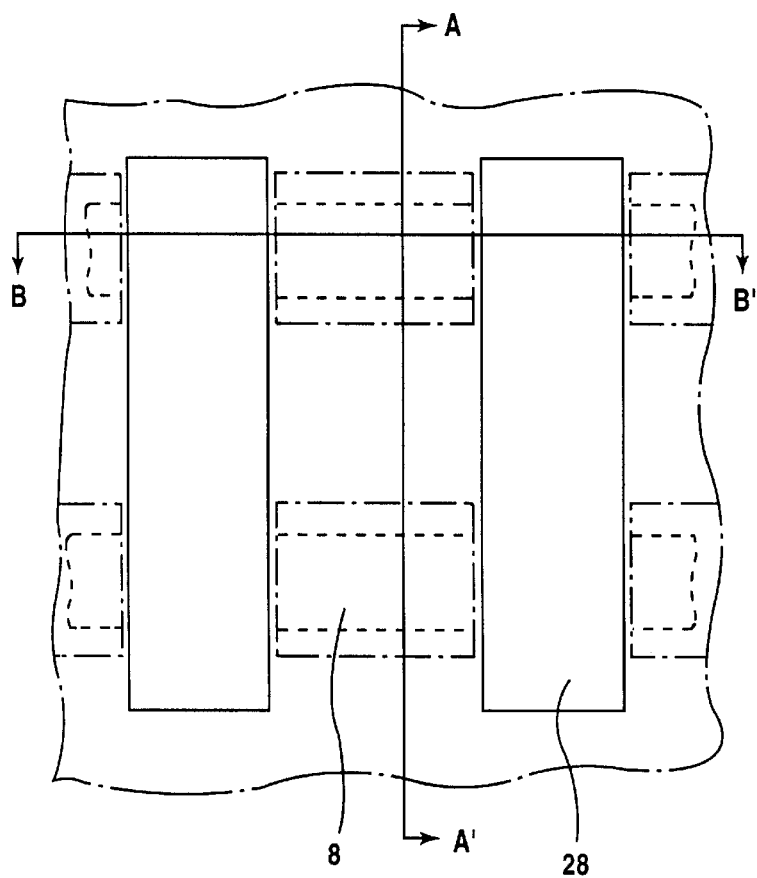
Fig.12B
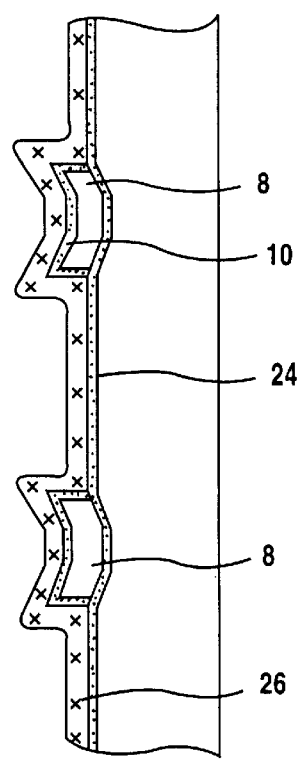
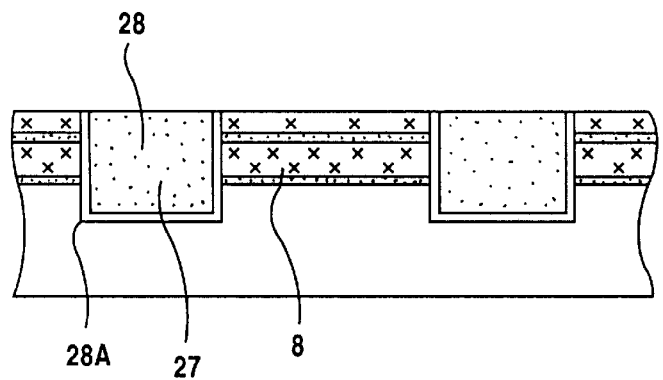
Fig.12C

Fig.14A
Fig.14B
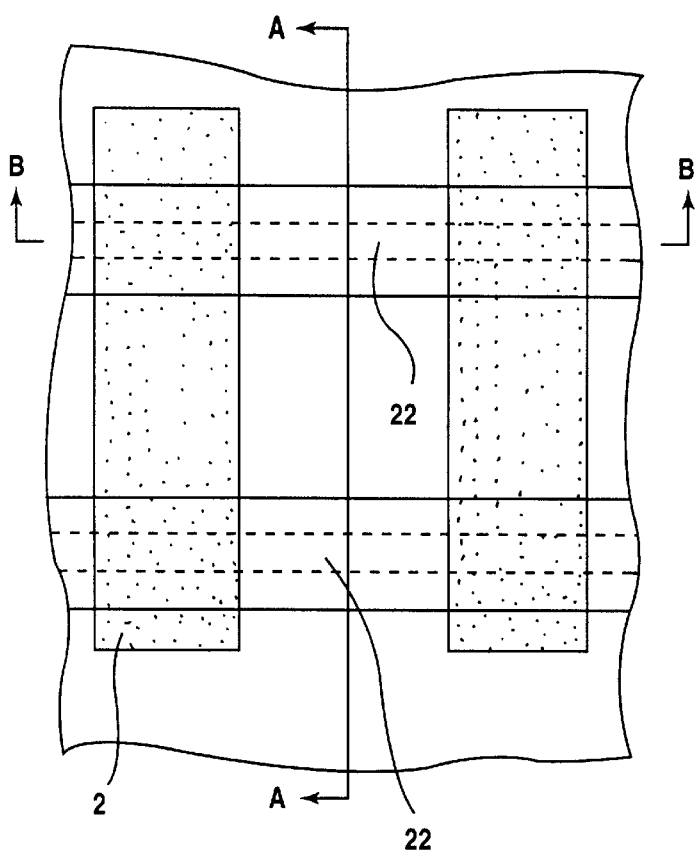
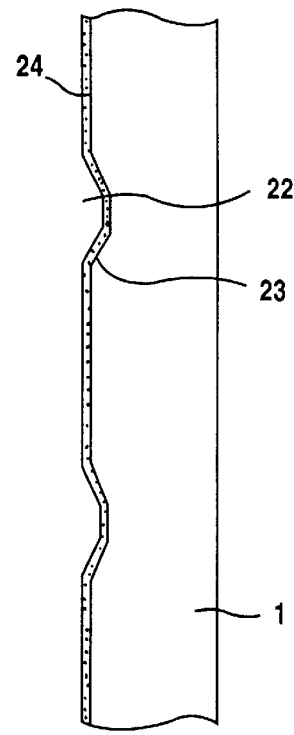
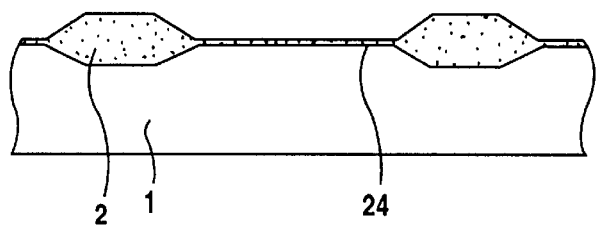
Fig.14C

Fig.15A
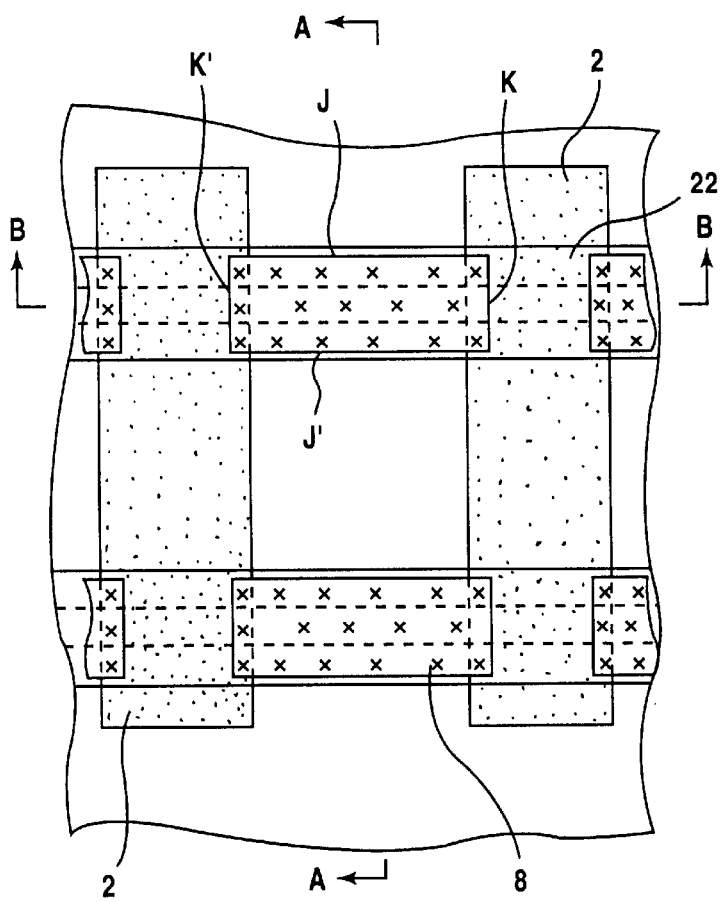
Fig.15B
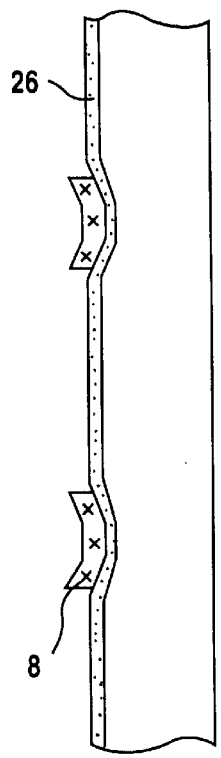
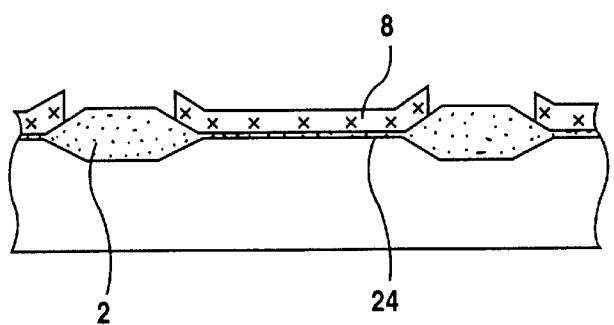
Fig.15C

Fig.16A
Fig.16B
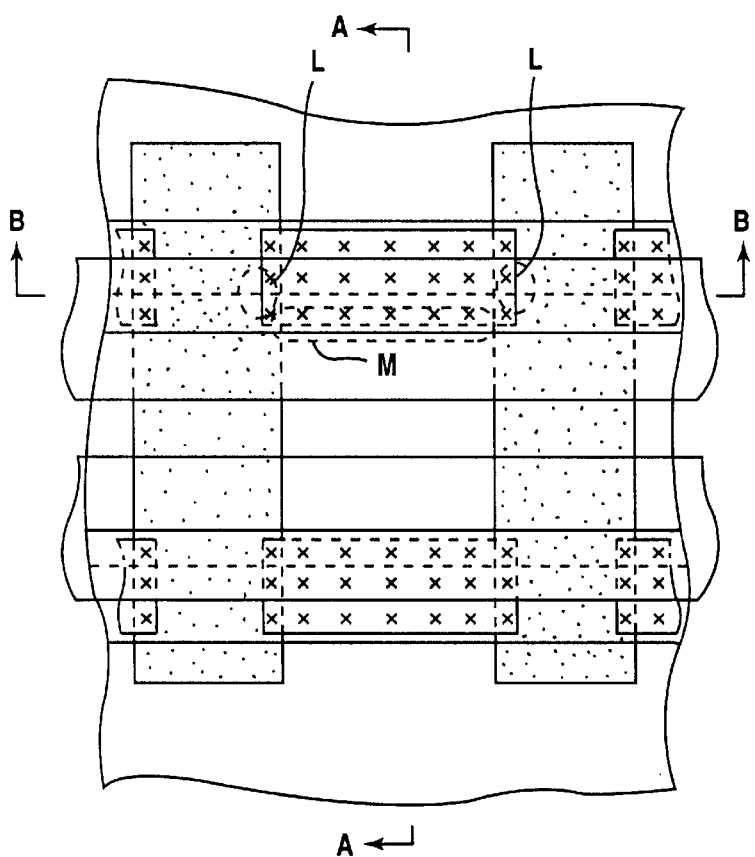
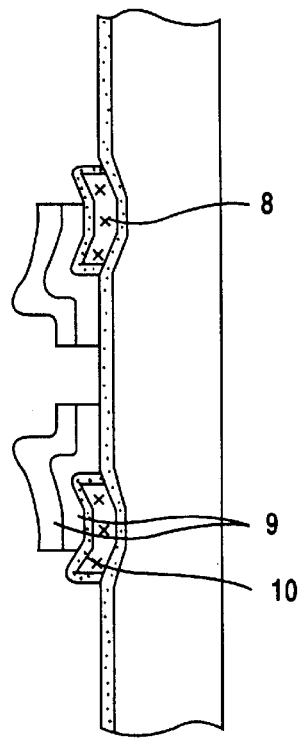
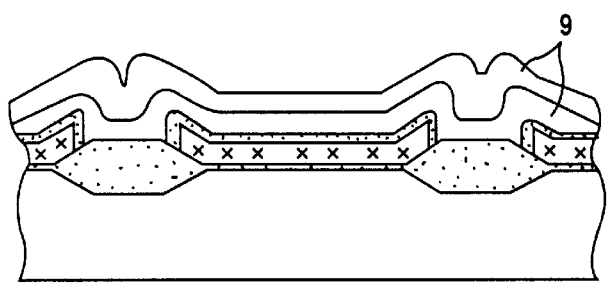
Fig.16C

Fig.17A
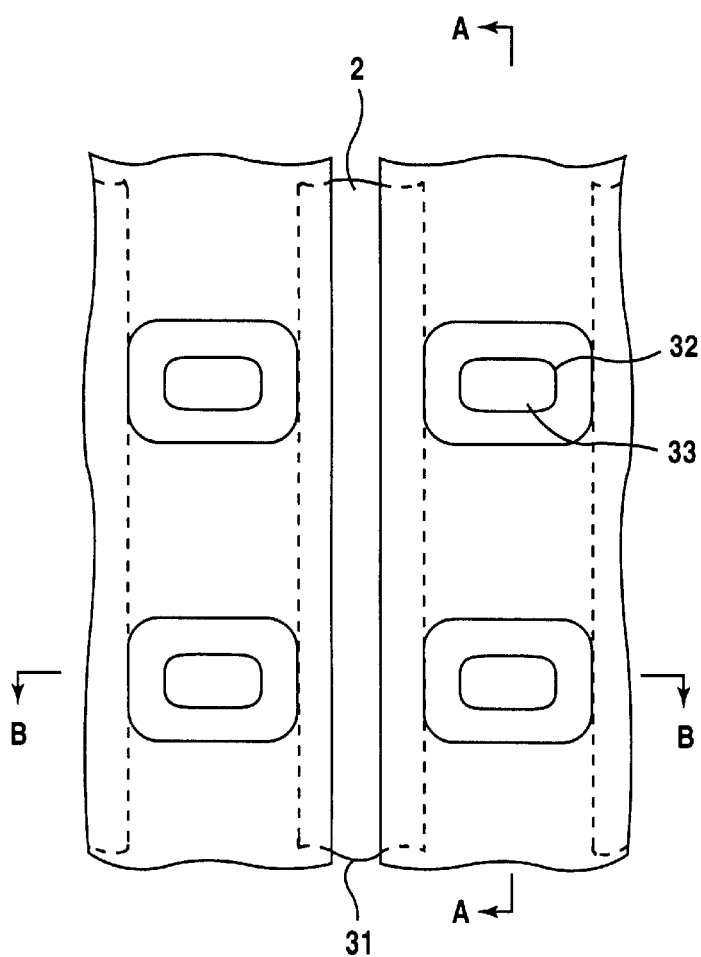
Fig.17B
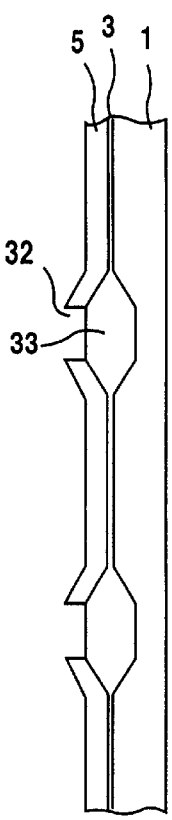
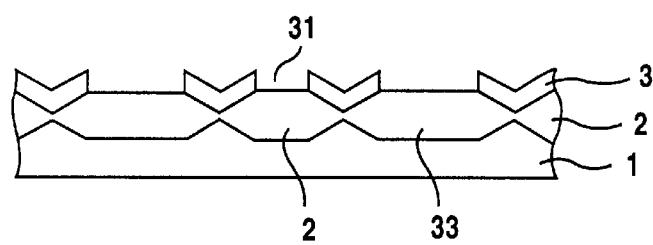
Fig.17C

Fig.18A
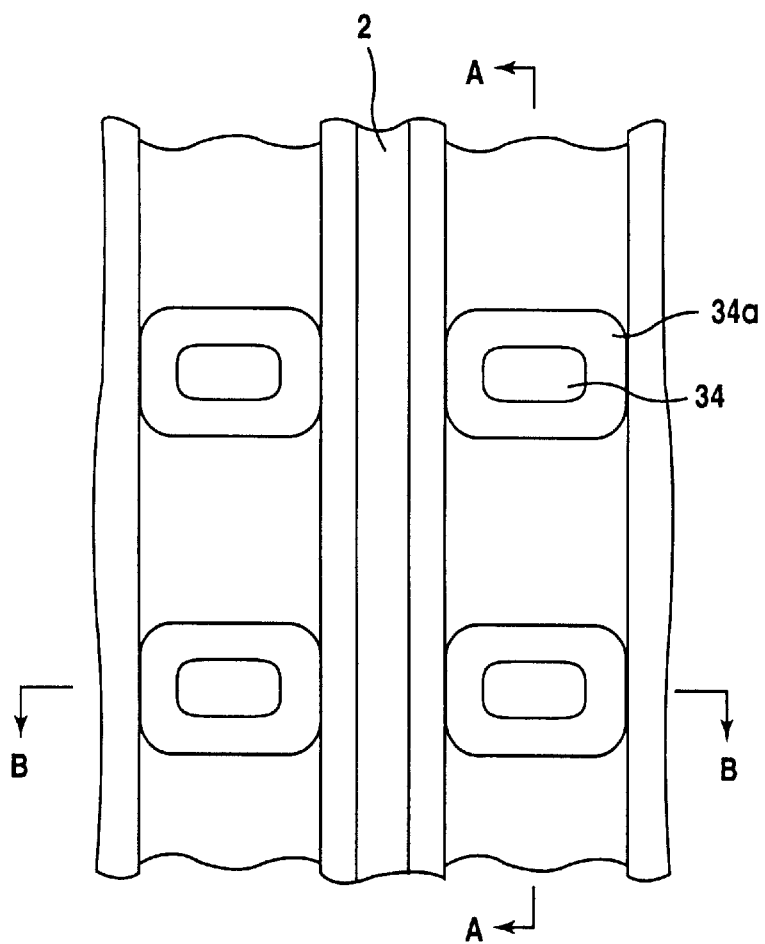
Fig.18B
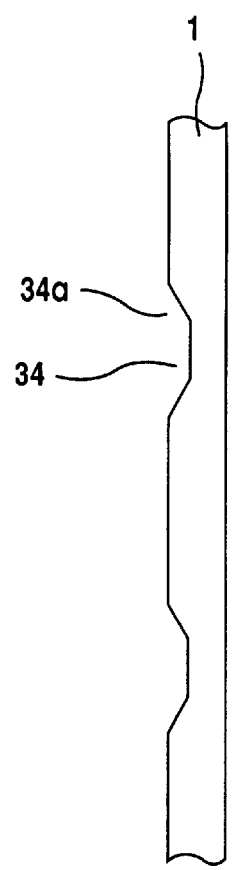
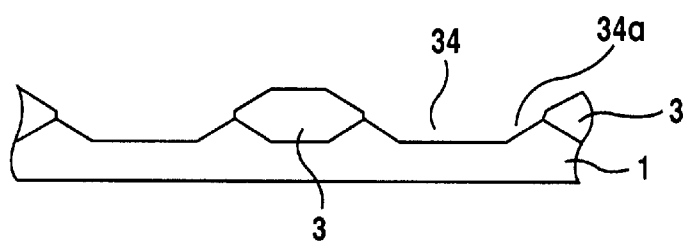
Fig.18C

Fig.19A
Fig.19B
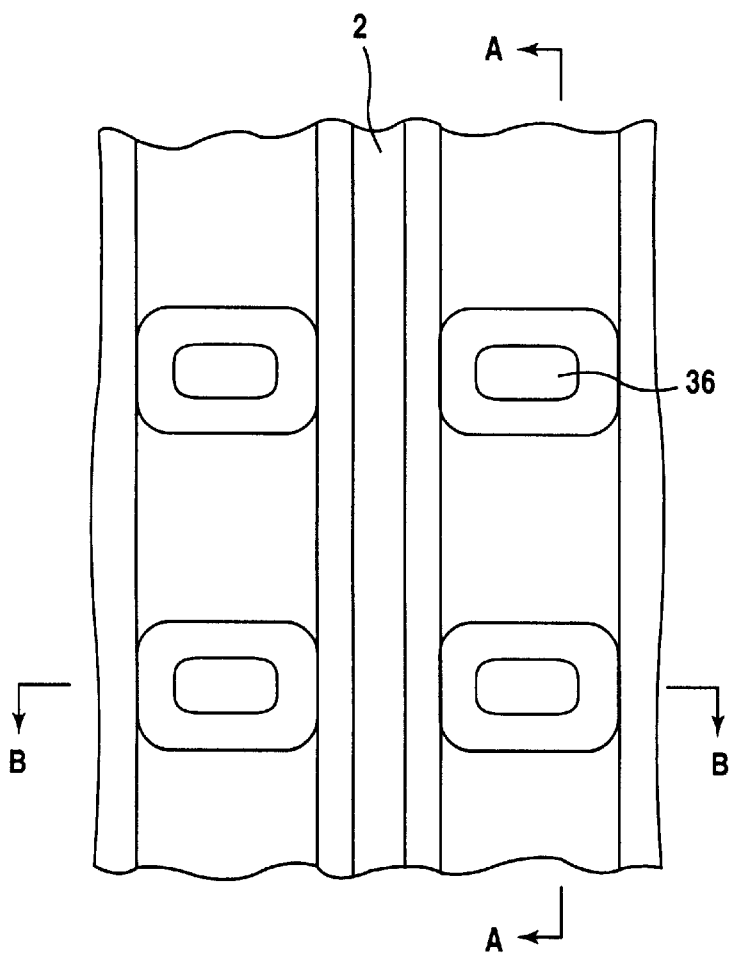
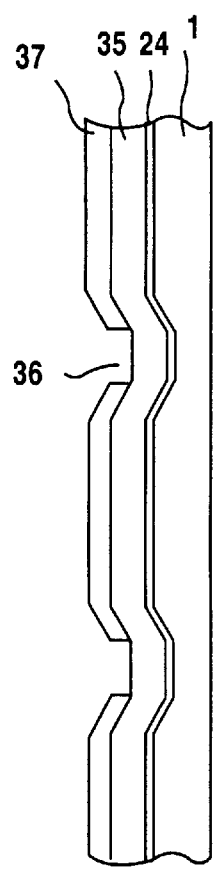
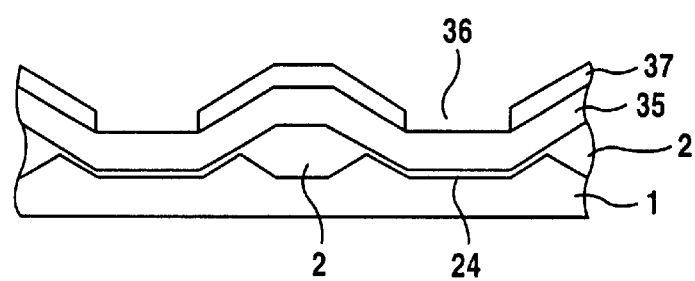
Fig.19C

Fig.21A
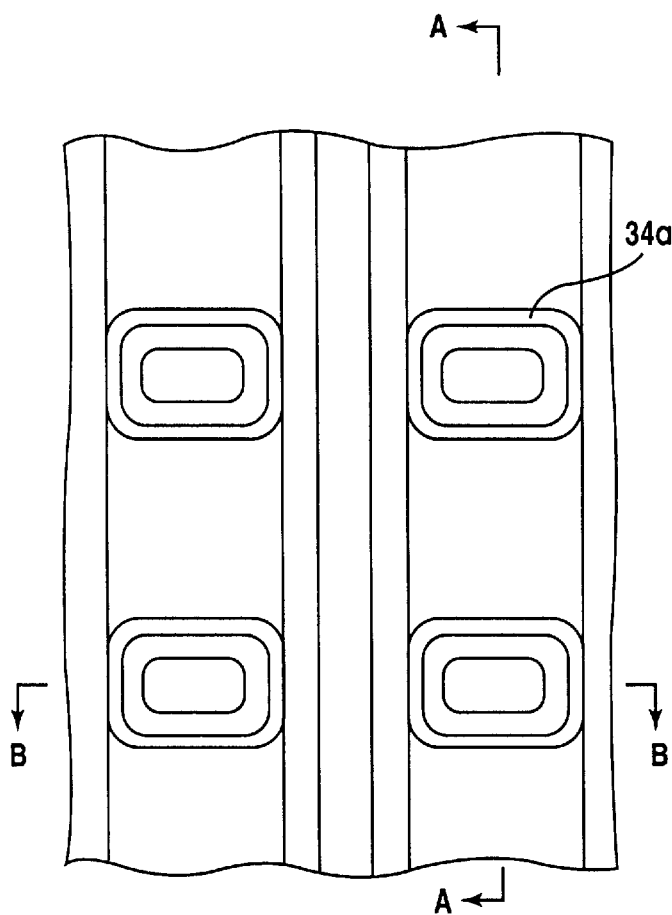
Fig.21B
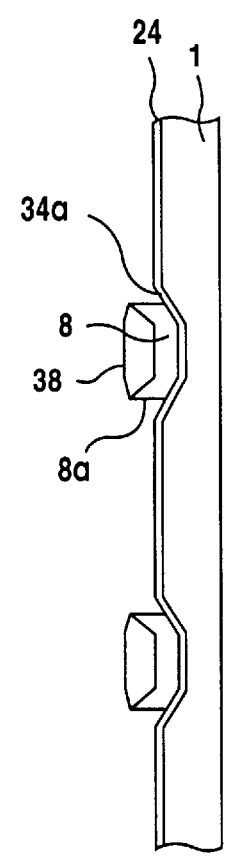
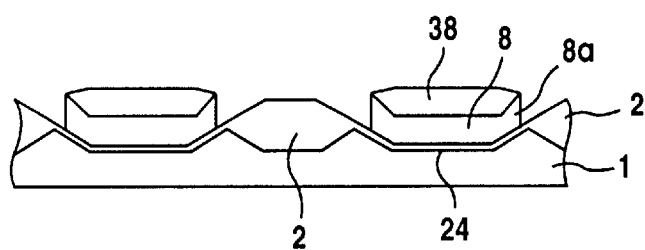
Fig.21C

Fig.22A
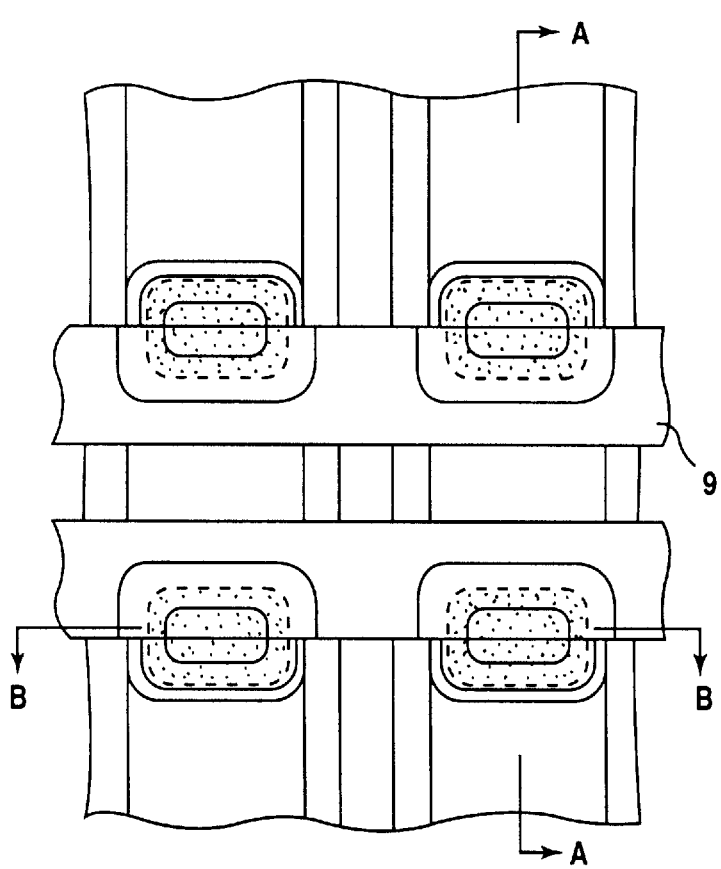
Fig.22B
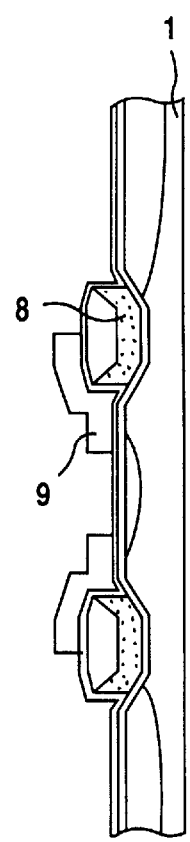
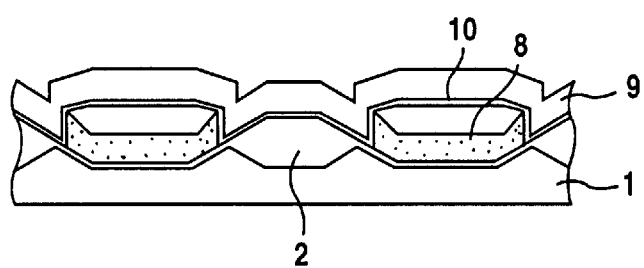
Fig.22C

NONVOLATILE SEMICONDUCTOR MEMORY DEVICE AND MANUFACTURING METHOD THEREFOR

BACKGROUND OF THE INVENTION

1. Field of the Invention

The present invention relates to a nonvolatile semiconductor memory device and a manufacturing method therefor, and more particularly to an improvement in the number of rewriting information in a split-gate-type flash memory.

2. Description of the Relatrd Art

A method of manufacturing a split-gate-type flash memory, which is a conventional nonvolatile semiconductor memory device (refer to, for example, Japanese Patent Application No. 9-42478) will now be described with reference to the drawings.

As shown in FIG. 37, the foregoing split-gate-type flash memory is a flash memory incorporating a control gate 100 formed from an upper portion of the floating gate 102 to the side portion of the same through an insulating film 101. Referring to FIGS. 34 to 37, the processes for manufacturing the foregoing flash memory will now be described.

Initially, a first gate insulating film 104 in the form of a $SiO_2$ film is formed on a semiconductor substrate 103. Then, a polycrystalline silicon film 105 is laminated. Then, P ions are implanted to form the floating gate 102 shown in FIG. 37 and attempted to be formed (see FIG. 34).

Then, a silicon nitride film 106, which is an oxidation resistance film, is formed in such a manner that the polycrystalline silicon film 105, which is a region in which the floating gate 102 will be formed, is exposed. The silicon nitride film 106 is used as a mask to form a mini LOCOS oxide film 107 (see FIG. 35).

Then, the silicon nitride film is etched, and then the mini LOCOS oxide film 107 is used as a mask to etch and remove the polycrystalline silicon film 105 so that the floating gate 102 is formed.

Then, the first gate insulating film 104 is isotropically etched with hydrofluoric acid etching solution so that the first gate insulating film 104 is left in only a portion directly below the floating gate (or etched and removed in such a manner that the first gate insulating film 104 is somewhat left around the floating gate 102).

Then, a second insulating film 101 made of silicon oxide (a thermal oxidation film or a CVD film) is formed on the entire surface (see FIG. 36).

Then, a polycrystalline silicon film is formed on the second insulating film 101, and then a patterning process is performed so that a control gate 100 extending from the upper portion of the floating gate 102 to the side portion of the same is formed. The thus-formed floating gate 102 and the control gate 100 are used as masks when impurities are implanted onto the semiconductor substrate 103. Thus, a source region and a drain region (not shown) are formed. As a result, the split-gate-type flash memory can be formed.

A program has been written on the above-mentioned split-gate-type flash memory by turning transistors of memory cells (hereinafter called "selected cells"), on which data must be written, on to implant electrons into the floating gate 102.

Moreover, as a region surrounded by a dashed line shown in FIG. 37, the polycrystalline silicon film 105 on the upper surface of the floating gate 102 is oxidized so that a mini LOCOS oxide film 107 is formed on the polycrystalline silicon film 105. Then, a projection 108 is formed at the leading end of the bird's beak. Concentration of electric fields to the projection 108 is used to remove electrons of the floating gate 102 from the floating gate 102 toward the control gate 100 so that the program is erased.

FIG. 5 is a plan view showing the above-mentioned split-gate-type flash memory. FIG. 37 is a cross sectional view taken along line B—B. A rectangular portion (hatched with dots) indicated with an elongated alternate long and short dash line is in the form of a LOCOS oxide film, while rectangular portions indicated with an alternate long and two short dashes line and a dashed line are the floating gate 102 and the mini LOCOS oxide film 107. A solid line extending laterally indicates the control gate 100.

The above-mentioned projection 108 is formed mainly by dint of the shape of the bird's beak of the mini LOCOS oxide film. That is, the bottom surface of the bird's beak has an inclination which is raised in a direction toward the periphery. Therefore, the sharp projection 108 is formed on the entire circumference of the floating gate.

However, the above-mentioned inclination of the mini LOCOS oxide film 107 is unsatisfactory in a viewpoint of the shape of the projection.

SUMMARY OF THE INVENTION

In view of the foregoing, a first aspect has a structure that an end of the floating gate is disposed in the inclined portions of the bird's beak of the LOCOS oxide so as to solve the problem.

A second aspect has a structure that an end of the mini LOCOS oxide film formed on the floating gate is disposed in the inclined portion of the bird's beaks of the LOCOS oxide film.

If an inclined portion is provided for the bird's beak portion of the LOCOS oxide film as shown in FIG. 6, the floating gate formed on the bird's beak has an inclined portion. Hitherto, an end T of the floating gate is formed in the horizontal portion formed between points Y and Z. Therefore, a corner C formed by a line YZ and a line T has an angle of substantially 90°. However, the present invention has a structure that an end S is formed in an inclined portion XY. Therefore, a corner B has an acute angle. Thus, the projection has a sharp shape.

A third aspect has the steps of: forming an oxidation resistance film in the form such that a silicon film disposed between a first LOCOS oxide film and a second LOCOS oxide film is exposed;

forming a mini LOCOS oxide film by oxidizing the silicon film through the oxidation resistance film; and forming a floating gate by etching the silicon film such that the mini LOCOS oxide film is used as a mask.

Thus, the above-mentioned problem can be solved. Plurality of LOCOS oxide films are comprised, and the first LOCOS oxide film and a second LOCOS oxide film show two LOCOS oxide films adjacent to each other. That is, the mini LOCOS oxide film is grown from the end of the oxidation resistance film, as shown in FIG. 1. Therefore, when the oxidation resistance film in the form such that the silicon film is exposed is formed between the first LOCOS oxide film and the second LOCOS oxide film juxtaposed each other, the end of the mini LOCOS oxide film is formed in the inclined portion of the LOCOS oxide film. Thus, the end of the floating gate can furthermore be sharpened.

A fourth aspect, as shown in FIG. 4, has a structure that a sharp acute portion 12 is downwards formed from a top flat portion of each of the LOCOS oxide films 2A and 2B to the inclined portion, as shown in FIG. 4. Since a reverse tunneling phenomenon occurs because of the foregoing fact, a spacer 11 is formed to prevent the foregoing phenomenon.

A fifth aspect has a structure that an end of the floating gate is disposed in a recess provided for the semiconductor substrate by removing the LOCOS oxide film and formed to have an inclined portion.

A sixth aspect has a structure that an end of the floating gate is disposed in a recess provided for the semiconductor substrate by combining isotropic etching and anisotropic etching and formed to have an inclined portion.

According to another aspect, there is provided a method of manufacturing a semiconductor device of the foregoing type. The first and second LOCOS oxide films can be formed so as to be elongated in parallel each other in a direction, or so be island-like shaped.

BRIEF DESCRIPTION OF THE DRAWINGS

FIGS. 7A–7C are a plan view and cross sectional views showing a method of manufacturing a nonvolatile semiconductor memory device according to a second embodiment of the present invention.

FIGS. 9A–9C are a plan view and cross sectional views showing the method of manufacturing the nonvolatile semiconductor memory device according to the second embodiment of the present invention.

FIGS. 10A–10C are a plan view and cross sectional views showing the method of manufacturing the nonvolatile semiconductor memory device according to the second embodiment of the present invention.

FIGS. 12A–12C are a plan view and cross sectional views showing the method of manufacturing the nonvolatile semiconductor memory device according to the second embodiment of the present invention.

FIGS. 14A–14C are a plan view and cross sectional views showing the method of manufacturing the nonvolatile semiconductor memory device according to the third embodiment of the present invention.

FIGS. 15A–15C are a plan view and cross sectional views showing the method of manufacturing the nonvolatile semiconductor memory device according to the third embodiment of the present invention.

FIGS. 16A–16C are a plan view and cross sectional views showing the method of manufacturing the nonvolatile semiconductor memory device according to the third embodiment of the present invention.

FIGS. 17A–17C are a plan view and cross sectional views showing the method of manufacturing the nonvolatile semiconductor memory device according to the fourth embodiment of the present invention.

FIGS. 18A–18C are a plan view and cross sectional views showing the method of manufacturing the nonvolatile semiconductor memory device according to the fourth embodiment of the present invention.

FIGS. 19A–19C are a plan view and cross sectional views showing the method of manufacturing the nonvolatile semiconductor memory device according to the fourth embodiment of the present invention.

FIGS. 21A–21C are a plan view and cross sectional views showing the method of manufacturing the nonvolatile semiconductor memory device according to the fourth embodiment of the present invention.

FIGS. 22A–22C are a plan view and cross sectional views showing the method of manufacturing the nonvolatile semiconductor memory device according to the fourth embodiment of the present invention.

PREFERRED EMBODIMENT OF THE PRESENT INVENTION

An embodiment of a method of manufacturing a nonvolatile semiconductor memory device according to the present invention will now be described.

First Embodiment

Figure 1:
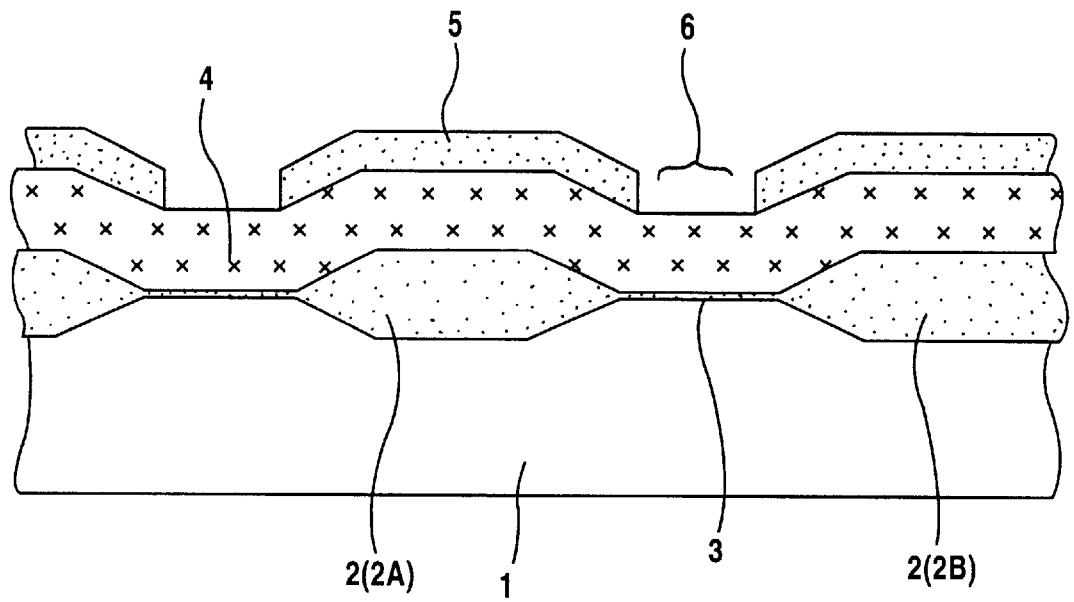
FIG. 1 is a cross sectional view showing a method of manufacturing a nonvolatile semiconductor memory device according to a first embodiment of the present invention.
Figure 5:
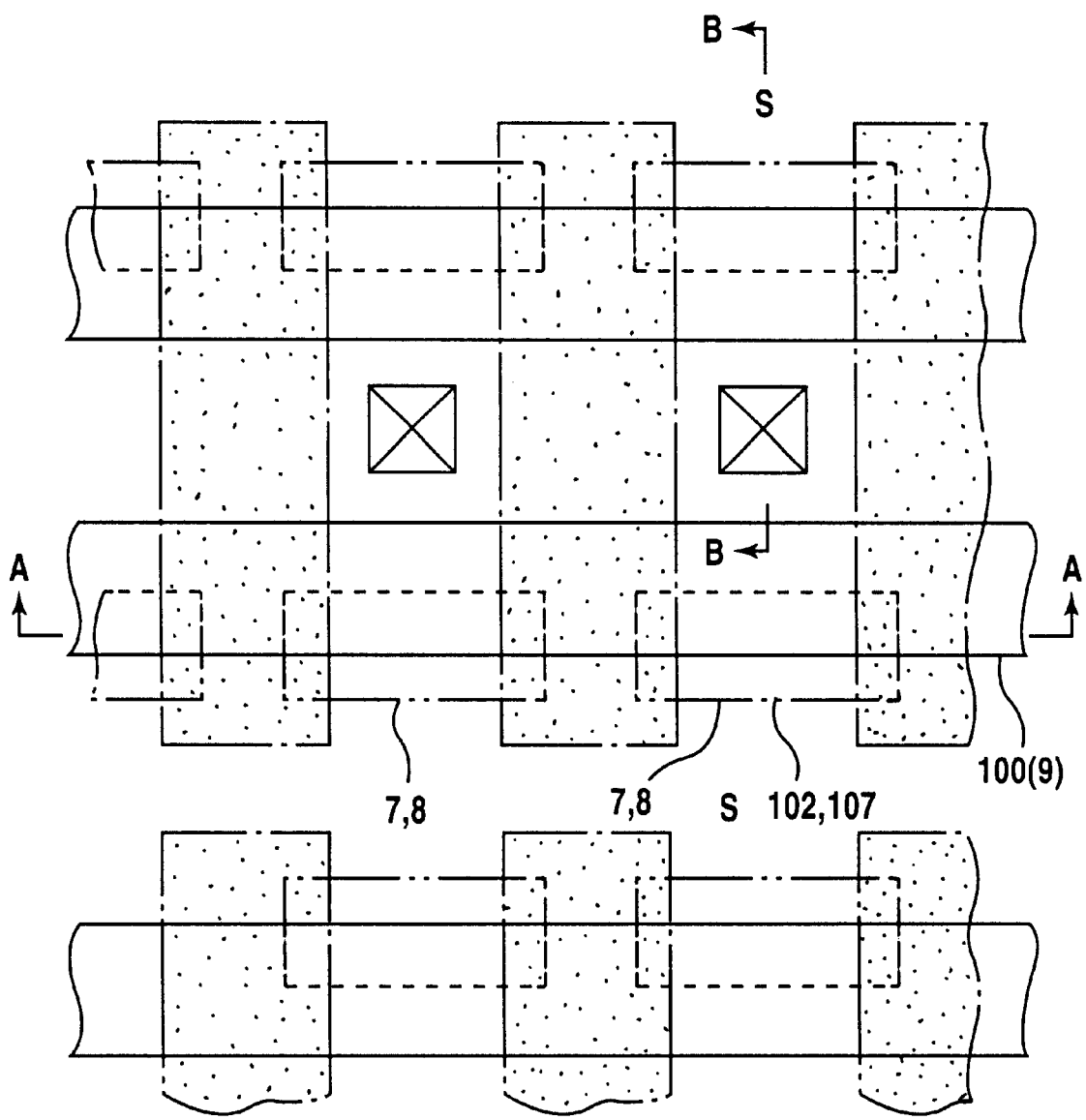
FIG. 5 is a plan view showing the nonvolatile semiconductor memory device.

As shown in FIG. 1 (which is a cross sectional view taken along line A—A shown in FIG. 5) and FIG. 5, a LOCOS oxide film 2 having a rectangular shape (the shape is not limited to the rectangular shape and a variety of shapes including an elliptic shape) is initially formed. A first gate insulating film 3 having a thickness of about 100 Å is formed between the LOCOS oxide film 2 by thermal oxidation. For convenience to easily describe the embodiment, a second LOCOS oxide film 2 from the right-hand end is called a first LOCOS oxide film 2A and a right-hand end LOCOS oxide film 2 is called a second LOCOS oxide film 2B. A silicon film 4 having a thickness of about 1500 Å is formed by, for example, a CVD method. Although the silicon film may be a single-crystal silicon film, a polycrystalline silicon film is employed hereinafter. Moreover, an oxidation resistance film (silicon nitride film) 5 having a thickness of about 500 Å is formed on the polycrystalline silicon film 4. An opening 6 is, by a known patterning technique, formed in the silicon nitride film 5 through a photoresist (not shown). Thus, the polycrystalline silicon film 4 in a region in which a mini LOCOS oxide film 7 will be formed (in a region in which a floating gate will be formed) is exposed.

Then, a process for introducing impurities is performed. In this process, P ions are implanted in a dose quantity of about 2.5 E14/cm$^2$ at an acceleration of 25 KeV. Since the foregoing process for implanting ions is performed to make the polycrystalline silicon film 4 to be the floating gate, the impurities may be introduced into the entire surface before the silicon nitride film is formed.

Figure 2:
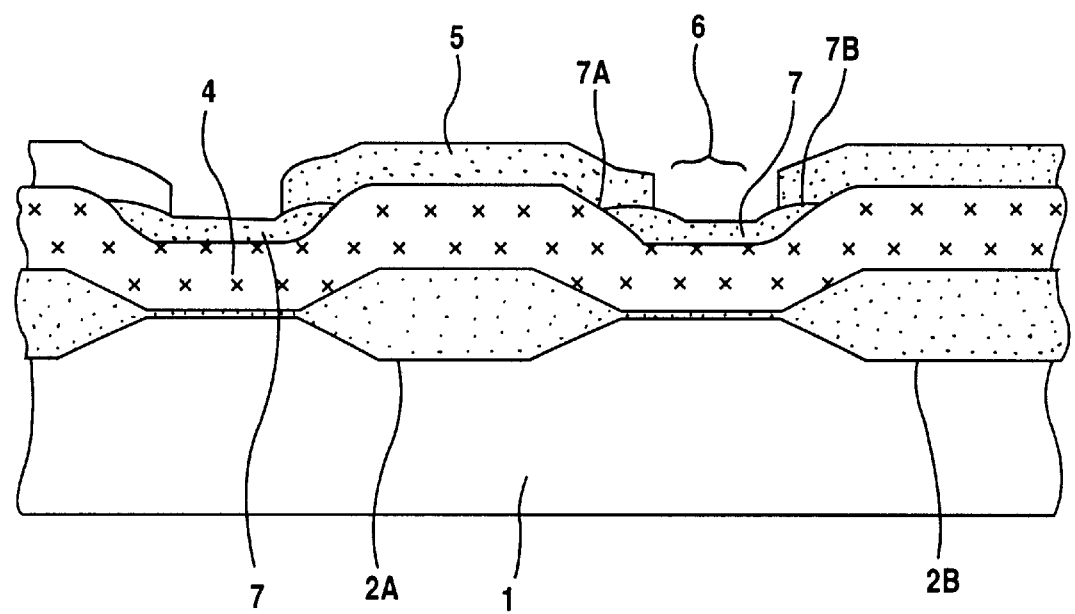
FIG. 2 is a cross sectional view showing the method of manufacturing the nonvolatile semiconductor memory device according to a first embodiment of the present invention.

Then, the silicon nitride film 5 is used as a mask so that the polycrystalline silicon film 4 exposed through the opening 6 is selectively oxidized so that the mini LOCOS oxide film 7 is formed, as shown in FIG. 2.

The thickness of the mini LOCOS oxide film 7 is about 1500 Å which is the largest thickness realized at the central portion thereof. The thickness is reduced toward the peripheral portion of the LOCOS oxide film 7. In particular, the thickness at the peripheral portion is considerably reduced (for example, about 100 Å or smaller) in order to be introduced into a portion below the lower surface of the silicon nitride film 5 such that the silicon nitride film 5 is moved upwards. The thin region is formed inwardly to a position apart from the end of the opening of the silicon nitride film for a distance of about 0.05 μm (500 Å). The width of the mini LOCOS oxide film 7 is about 0.8 μm (8000 Å) when the size of the opening is about 0.7 μm.

This embodiment is characterized in the opening 6 through which the polycrystalline silicon film 4 is exposed is formed between the first LOCOS oxide film 2A and the second LOCOS oxide film 2B. Thus, leading ends 7A and 7B of bird's beaks of the mini LOCOS oxide film 7 are disposed in inclined portions of bird's beaks of the first LOCOS oxide film 2A and the second LOCOS oxide film 2B. Therefore, a projection can furthermore be sharpened by etching the floating gate to be described later.

Figure 6:
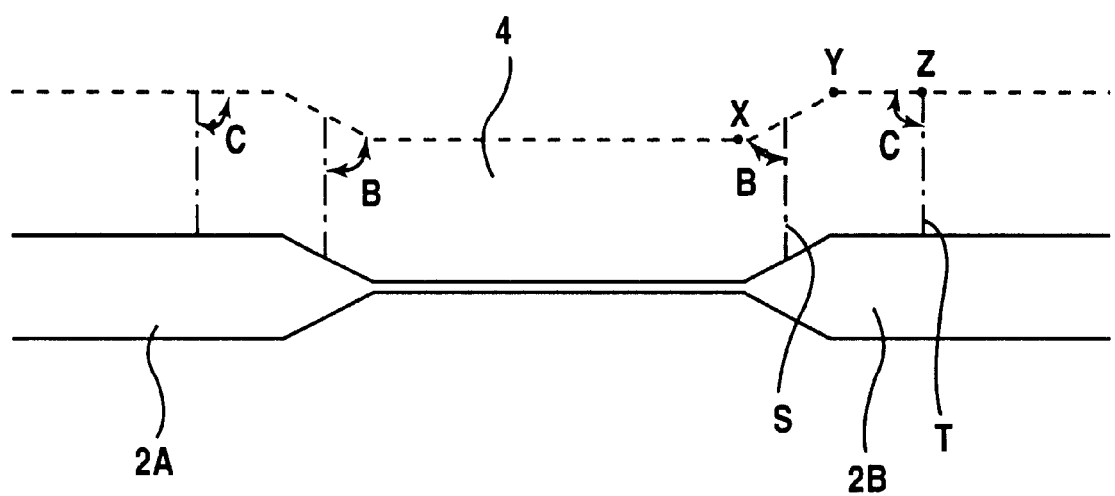
FIG. 6 is a diagram showing a process for sharpening a floating gate.

Referring to FIG. 6, etching is performed at a predetermined position of the inclined portion (X-Y) of the polycrystalline silicon film 4 which is direct trace of the inclined portion of the bird's beak of the second LOCOS oxide film 2B. That is, etching is performed along a segment S. Therefore, a corner B formed by the segment X-Y and the segment S can be made to be an acute angle.

Then, a process for removing the silicon nitride film 5 is performed.

To remove natural oxide film formed on the surface of the silicon nitride film 5, firstly hydrofluoric acid (for example, HF:H$_2$O=1:25) is employed to etch off a thickness of about 160 Å in thermal oxide film terms. Then, the silicon nitride film 5 is removed by phosphoric acid. Then, a post process is performed such that hydrofluoric acid (HF:H$_2$O=1:25) is employed to perform an etching-off process by about 50 Å in thermal oxide film terms. Then, a mixture solution NH$_4$OH/H$_2$O$_2$/H$_2$O (composition ratio=1:2:5) is employed to perform a rinsing process. The rinsing process is performed to remove organic substances and heavy metal so that the adhesive property of water to the surface is weakened to easily perform a hydrofluoric acid process which will be performed as a post process.

Then, the exposed mini LOCOS oxide film 7 is etched with buffered hydrofluoric acid (for example, HF:H$_2$O:NH$_4$F=1:40:20) so that the upper surface of the mini LOCOS oxide film 7 is removed by cutting by a thickness of about 100 Å to about 300 Å.

In this embodiment, the upper surface of the mini LOCOS oxide film 7 is removed by cutting by a thickness of about 100 Å to about 300 Å. Thus, a portion of the bird's beak in the outer periphery of the mini LOCOS oxide film 7 is removed so that jaggies of the outer periphery of the LOCOS oxide film 2A, 2B are removed. As a result, a relatively smooth shape in the form of a substantially elliptic-shape can be formed.

The projections of jaggies can quickly be etched away as a result of isotropic etching which is performed by the hydrofluoric acid process because a large quantity of etchant is brought into contact with the projections. Therefore, the jaggies in the peripheral portion can be prevented to form a smooth surface.

Figure 3:
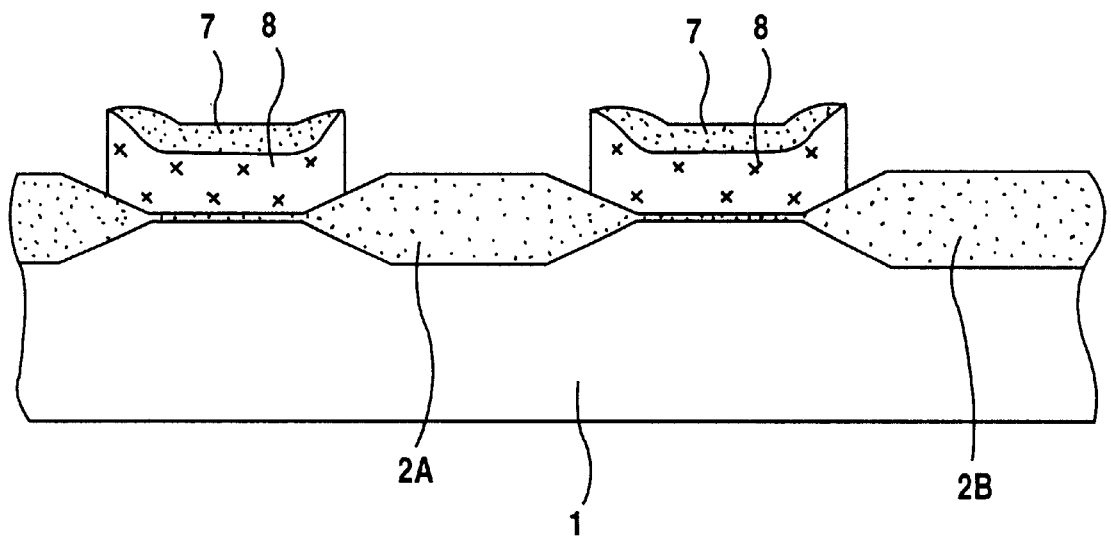
FIG. 3 is a cross sectional view showing the method of manufacturing the nonvolatile semiconductor memory device according to a first embodiment of the present invention.

Then, a next process is performed in which the mini LOCOS oxide film 7 etched as shown in FIG. 3 is used as a mask when the polycrystalline silicon film 4 is etched so that a floating gate 8 is formed. An ECR etcher is operated to etch the polycrystalline silicon film 4 under conditions that Cl$_2$ gas at a flow rate of 80 sccm and O$_2$ gas at a flow rate of 5 sccm are 8 through the second gate insulating film 10 (extend in the vertical direction with respect to the paper surface in the structure shown in FIG. 5). Then, the floating gate 8 and the control gate 9 are used as masks to implant impurities into the semiconductor substrate 1 so that a source region (not shown) and a drain region (not shown) are formed. Thus, a splitgate-type flash memory is formed.

Reference numeral 11 represents a spacer for preventing a reverse tunnel phenomenon which causes electron to be injected from the control gate to the floating gate because an acute portion 12 is formed owning to formation of the end of the floating gate at the bird's beaks of the LOCOS oxide films 2A and 2B. A spacer is formed on the side walls of the control gate to plug the acute portion 12.

Second Embodiment

A second embodiment of the present invention will now be described with reference to FIGS. 7A–7C to 13A–13C. Similar elements to those according to the first embodiment are omitted from description.

As shown in FIGS. 7A to 7C, an oxidation resistance film 5 is formed on a semiconductor substrate 1 so as to be used as a mask when the semiconductor substrate 1 is oxidized for obtaining LOCOS. Thus, an elongated LOCOS oxide film 21 is formed. To employed, the pressure is 5 mTorr, the RF power is 50 W and magnetron of 250 mA is employed.

The shape of the side wall portion of the thus-formed floating gate 8 is made such that the outer periphery of the mini LOCOS oxide film 7 is shaped into a smooth form. Moreover, the mini LOCOS oxide film 7 is used as the mask in the etching process. Therefore, linear deformation experienced with the conventional technology can be prevented and a smooth shape can be formed.

As described above, each of the both ends of the mini LOCOS oxide film is disposed in the inclined portions of the first LOCOS oxide film 2A and the second LOCOS oxide film 2B. Therefore, the corner B shown in FIG. 6 makes an acute angle. Since the bottom surface of the bird's beak of the mini LOCOS oxide film is inclined, the corner B can furthermore be sharpened.

Figure 4:
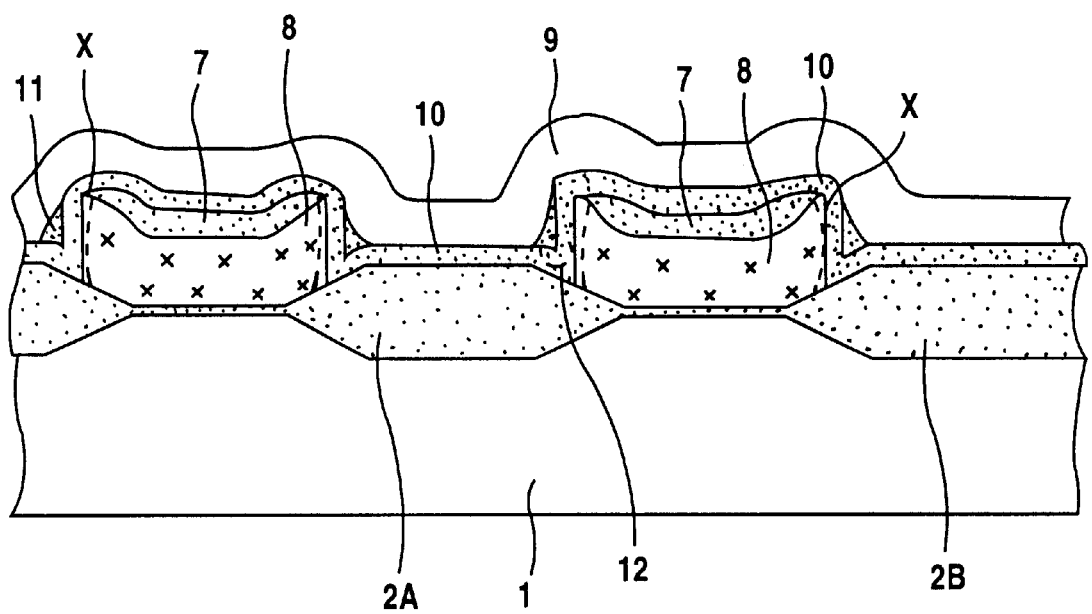
FIG. 4 is a cross sectional view showing the method of manufacturing the nonvolatile semiconductor memory device according to a first embodiment of the present invention.

Then, hydrofluoric acid (for example, HF:H2O=1:25) is employed to half-etch the first gate insulating film 3 except for a portion directly below the floating gate 7. Then, a silicon oxide film having a thickness of about 150 Å is formed on the entire surface by a CVD method. That is, as a result, as shown in FIG. 4, a second gate insulating film 10 is formed between the mini LOCOS oxide film 7 and the control gate 9.

Finally, a polycrystalline silicon film having a thickness of 1500 Å and a WSi$_x$ film having a thickness of 1500 Å are sequentially formed. Then, the control gate 9 is formed to sidewardly extend from the upper portion of the floating gate adjust the length of the bird's beak of the elongated LOCOS oxide film 21, a pad oxide film 3 may be formed.

Figure 8A:
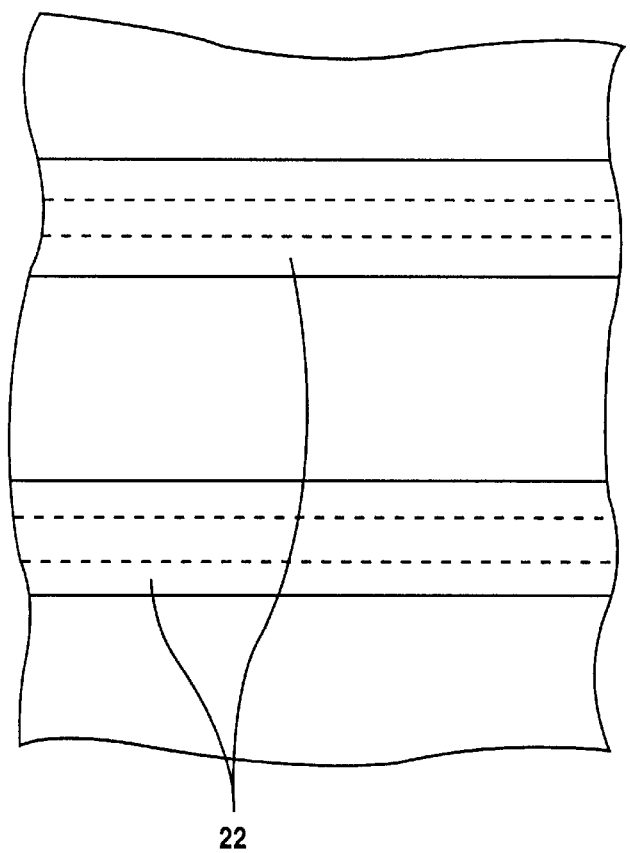
FIGS. 8A–8C are a plan view and cross sectional views showing the method of manufacturing the nonvolatile semiconductor memory device according to the second embodiment of the present invention.
Figure 8B:
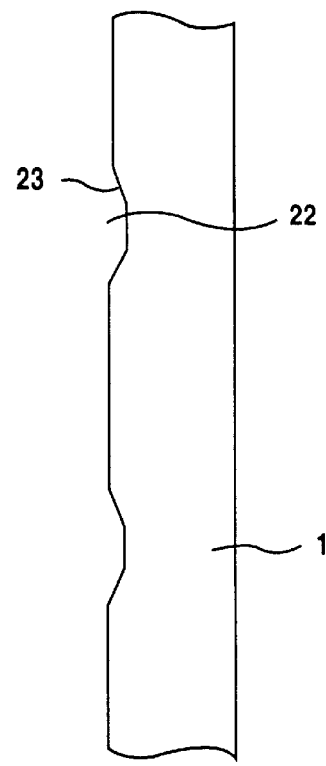
Figure 8C:
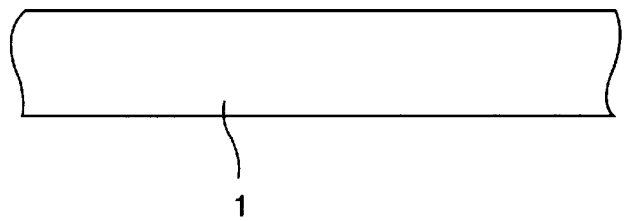

Then, as shown in FIGS. 8A to 8C, the elongated LOCOS oxide film 21 is removed so that an elongated recess 22 is formed. As a result, a portion from which the bird's beak has been removed is made to be an inclined portion 23.

Then, as shown in FIGS. 9A to 9C, a gate insulating film 24 is formed, and then a doped polycrystalline silicon film 25 is formed on the elongated recess 22. A projection is formed on the doped polycrystalline silicon film 25 by dint of the inclined portion 23. A mini LOCOS oxide film may be formed additionally.

Then, as shown in FIGS. 10A to 10C, an insulating film 10 is formed, and then a doped polycrystalline silicon film 26 is formed on an entire surface of the substrate 1.

Figure 11A:
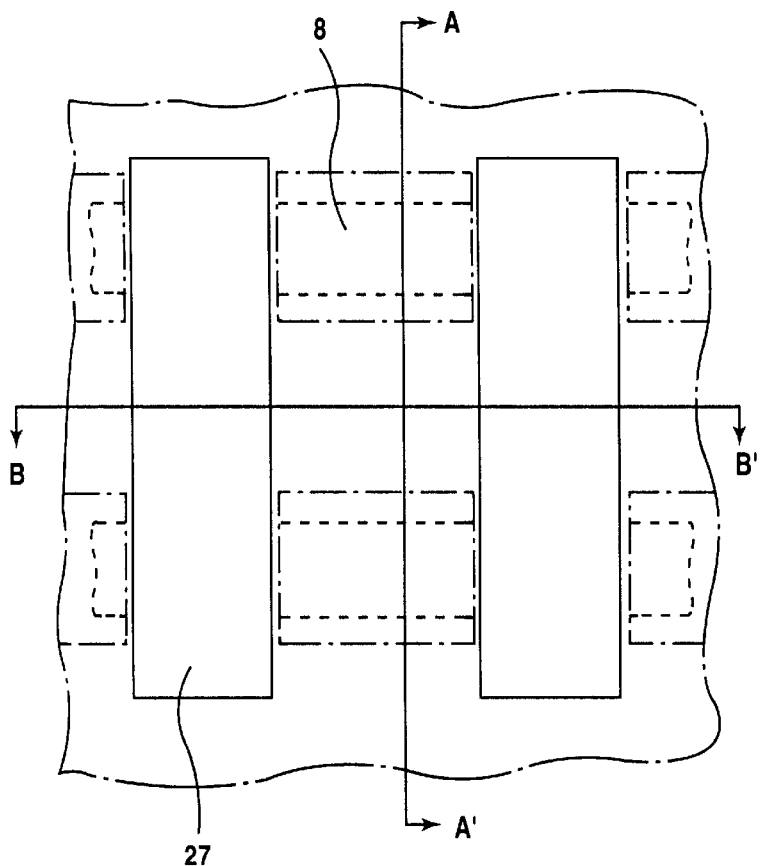
FIGS. 11A–11C are a plan view and cross sectional views showing the method of manufacturing the nonvolatile semiconductor memory device according to the second embodiment of the present invention.
Figure 11B:
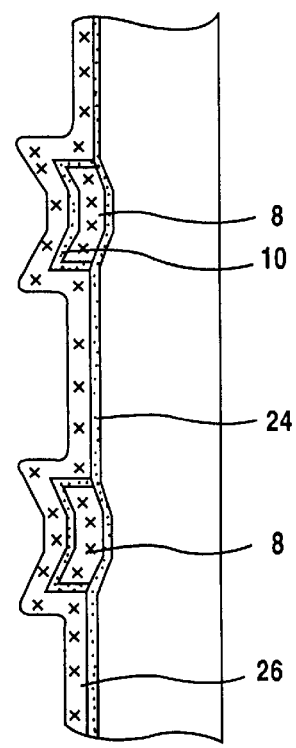
Figure 11C:
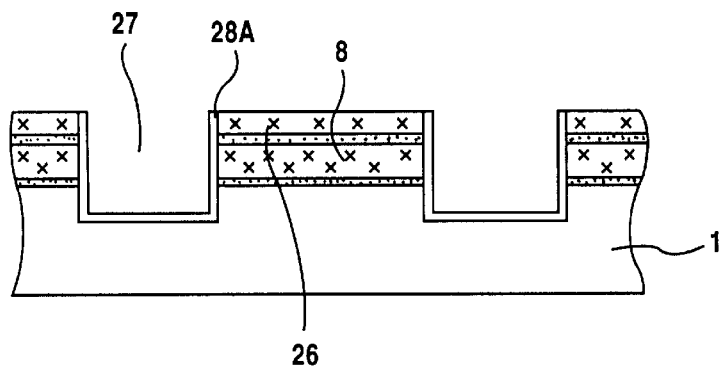

Then, as shown in FIGS. 11A to 11C, a trench 27 formed perpendicular to the lengthwise direction of the elongated recess 22 is formed so that the doped polycrystalline silicon film 25 is made to be a floating gate 8. After that, an insulating film 28A is formed on an inner wall of the trench 27 by using a thermal oxidation method.

Then, as shown in FIGS. 12A to 12C, the trench 27 is plugged by an insulating film 28 by CVD.

Figure 13A:
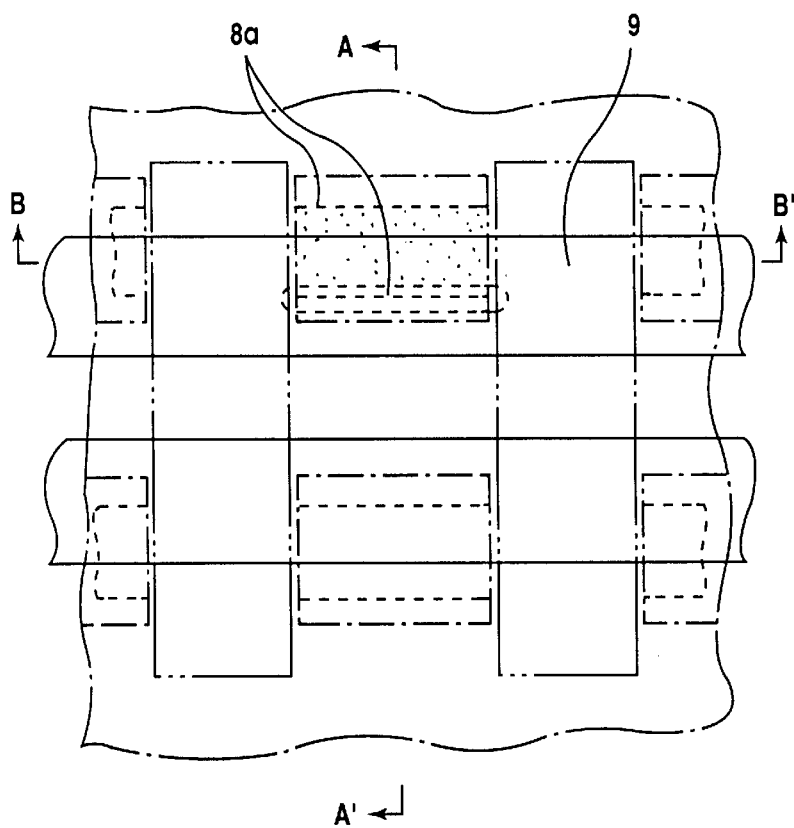
FIGS. 13A–13C are a plan view and cross sectional views showing the method of manufacturing the nonvolatile semiconductor memory device according to the second embodiment of the present invention.
Figure 13B:
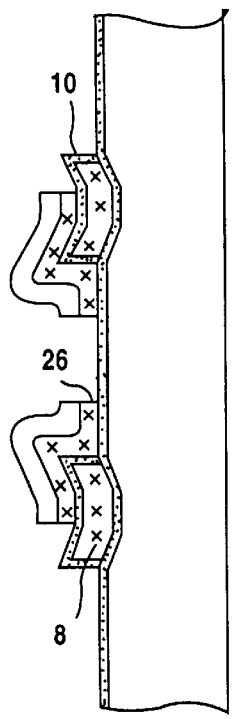
Figure 13C:
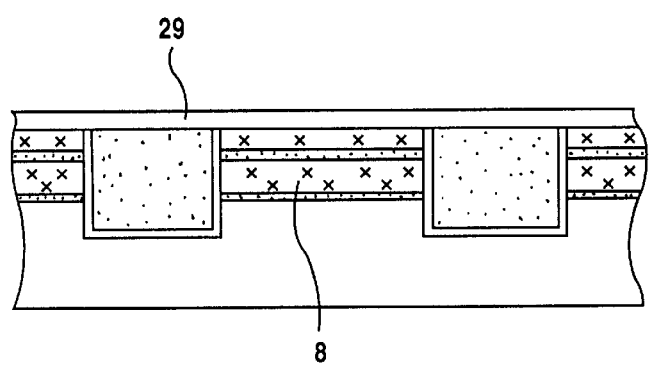

Then, as shown in FIGS. 13A to 13C, a tungsten silicide film 29 is formed on an entire surface of the semiconductor substrate, and then the doped polycrystalline silicon film 26 is selectively etched away to form a control gate 9. Then, the floating gate 8 and the control gate 9 are used as masks when impurity is implanted to form a source region and a drain region. As a result, a split-gate-type flash memory is formed. The flash memory according to this embodiment has a structure that a side surface 8a of the floating gate is disposed in the inclined portion 23 of the elongated recess 22. Therefore, the projection of the floating gate 8 can be sharpened.

Third Embodiment

A third embodiment will now be described with reference to FIGS. 14 to 16.

FIGS. 7 and 8 are similar to those according to the second embodiment. As shown in FIGS. 14A to 14C, a LOCOS oxide film 2 is formed in a direction perpendicular to the lengthwise direction of an elongated recess 22. The numeral 24 shows a gate insulating film.

Then, as shown in FIGS. 15A to 15C, a doped polycrystalline silicon film is formed on the entire surface, and then the doped polycrystalline silicon film is selectively etched away in such a manner that ends of the silicon film are disposed in the bird's beak of the LOCOS oxide film 2 and an inclined portion 23 of an elongated recess 22. Thus, a floating gate 8 of the doped polycrystalline silicon film is formed. That is, side surfaces J and J' of the floating gate 8 are disposed in the inclined portion 23 of the elongated recess 22, while side surfaces K and K' are disposed in the inclined portions of the bird's beaks of the LOCOS oxide film 2. Thus, all of the side surfaces of the floating gate 8 are disposed in the inclined portions. Therefore, all of projections can be sharpened. As a matter of course, a mini LOCOS oxide film may be formed on the floating gate 8 to furthermore sharpen the projections.

Then, as shown in FIGS. 16A to 16C, an insulating film 10 is formed, and then a doped polycrystalline silicon film is formed on the entire surface. Then, the doped polycrystalline silicon film is selectively etched away in such a manner that the doped polycrystalline silicon film extends from an upper portion of the floating gate 8 to the side portion of the same. Thus, a control gate 9 of the doped polycrystalline silicon film is formed. The control gate 9 may be formed into a double-layered structure including a metal-silicide layer. Then, the floating gate 8 and the control gate 9 are used as masks when ions are implanted so that a source region and a drain region are formed. As a result, a split-gate-type flash memory is formed. The flash memory according to this embodiment has the structure that both of the side surfaces M and L of the floating gate 8 are sharpened. Therefore, the lifetime can be elongated.

Fourth Embodiment

A fourth embodiment will now be described with reference to FIGS. 17 to 22.

As shown in FIGS. 17A to 17C, an oxidation resistance film 5 having an island-shape opening 32 between elongated openings 31 is formed on a semiconductor substrate 1. Then, an oxidation resistance film 5 is used as a mask when the semiconductor substrate 1 is oxidized. Thus, an elongated LOCOS oxide film 2 and an island-shape LOCOS oxide film 33 are formed.

Then, as shown in FIGS. 18A to 18C, the oxidation resistance film 5 and the island-shape LOCOS oxide film 33 are removed so that an island-shape recess 34 is formed. A portion around the island-shape recess 34 is formed into an inclined portion 34a.

Then, as shown in FIGS. 19A to 19C, a gate insulating film 24 and a doped polycrystalline silicon film 35 are formed on the entire surface. Then, an oxidation resistance film 37 having an opening 36 is formed on the island-shape recess 34.

Figure 20A:
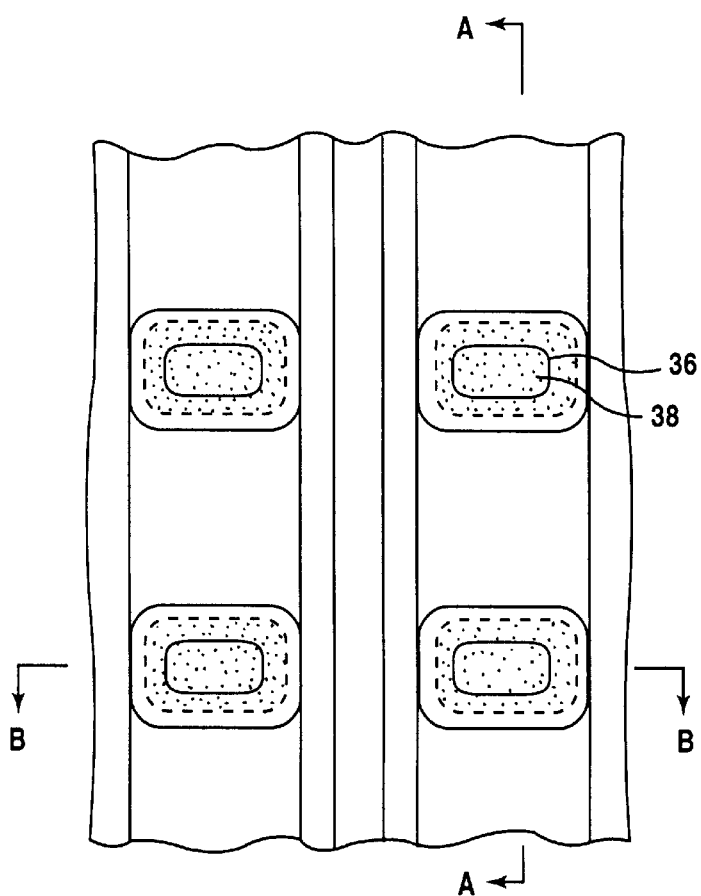
FIGS. 20A–20C are a plan view and cross sectional views showing the method of manufacturing the nonvolatile semiconductor memory device according to the fourth embodiment of the present invention.
Figure 20B:
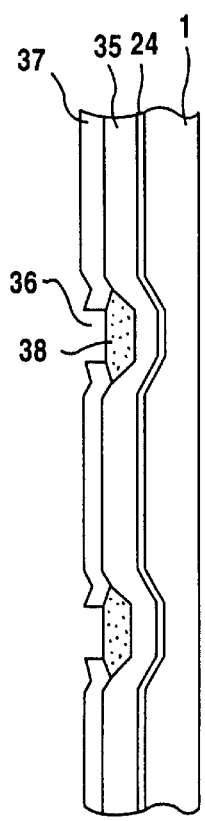
Figure 20C:
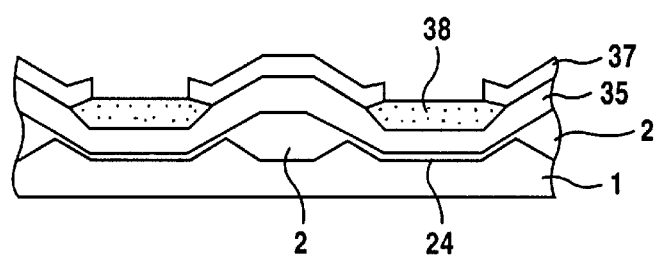
Figure 23:
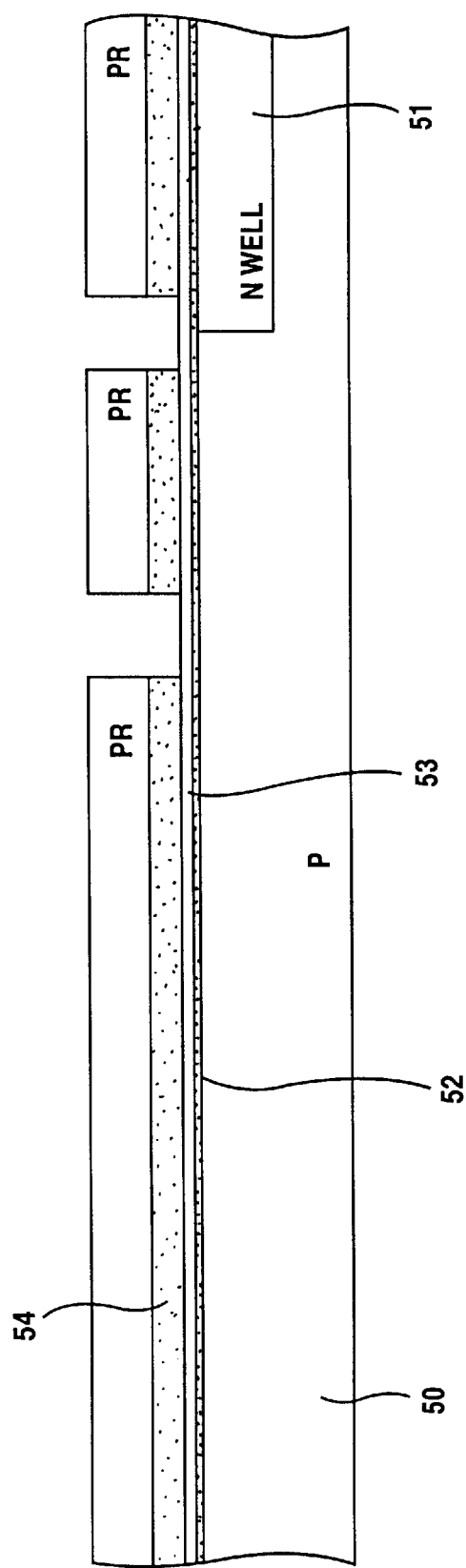
FIG. 23 is a cross sectional view showing a method of manufacturing a nonvolatile semiconductor memory device according to a fifth embodiment of the present invention.
Figure 24:
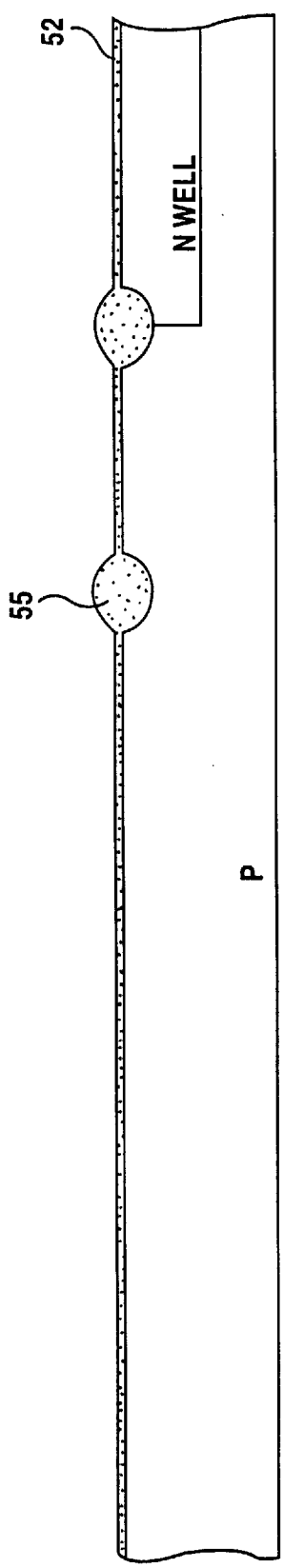
FIG. 24 is a cross sectional view showing a method of manufacturing a nonvolatile semiconductor memory device according to a fifth embodiment of the present invention.

Then, as shown in FIGS. 20A to 20C, the oxidation resistance film 37 is used as a mask when the doped polycrystalline silicon film 35 is oxidized. Thus, a mini LOCOS oxide film 38 is formed.

Then, as shown in FIGS. 21A to 21C, the oxidation resistance film 37 is removed. Then, the mini LOCOS oxide film 38 is used as a mask when the doped polycrystalline silicon film 35 is etched. Thus, a floating gate 8 is formed. Since the end of the floating gate 8 is disposed on the inclined portion 34A of the island-shape recess 34, the entire portion of the projection 8A of the floating gate 8 is sharpened.

Then, as shown in FIGS. 22A to 22C, an insulating film 10 is formed, and then a doped polycrystalline silicon film is formed on the entire surface. Then, the polycrystalline silicon film is etched to cause the silicon film to extend from an upper portion of the floating gate 8 to the side portion of the same. Thus, a control gate 9 is formed. The control gate 9 may be formed into a double-layered structure including a silicide layer. Then, the floating gate 8 and the control gate 9 are used as masks when ions are implanted. Thus, a source region and a drain region are formed. As a result, a split-gate-type flash memory is formed. The flash memory according to this embodiment has the projection of the floating gate 8 which is sharpened in the entire circumference. Since an electric current is uniformly supplied from the projection at an end of the floating gate 8 and disposed blow the control gate 9, the lifetime can be elongated.

Fifth Embodiment

A fifth embodiment will now be described. As can be understood from FIGS. 23–33, a method of manufacturing a nonvolatile semiconductor memory device is described in this embodiment in which an N channel TR and a P channel TR are integrally formed on the right-hand side. This embodiment will now be described with reference to a vertical cross sectional view similarly to line B—B.

Initially, an N-well 51 for the P channel is formed on a P type semiconductor substrate 50. Then, Polycrystalline silicon 53 having a thickness of about 700 Å and a silicon nitride film 54 having a thickness of about 1500 Å are sequentially laminated on an insulating film 52. Then, a silicon nitride film 54 is etched through a photoresist PR having a region opened to correspond to a LOCOS oxide film 55. (see FIG. 23, FIG. 1 and FIG. 5).

Then, the photoresist PR is removed, and LOCOS oxide films 55(, 2A and 2B) are formed by oxidation by using the silicon nitride film 54 as the oxidation resistance film. Then, the silicon nitride film 54 and the polycrystalline silicon 53 are removed by etching (see FIG. 24).

Then, a polycrystalline silicon 56 (given reference numeral 4 in the above-mentioned embodiment) having a thickness of about 1500 Å, a silicon nitride film 57 (given reference numeral 5 in the above-mentioned embodiment) having a thickness of about 500 Å and a photoresist PR are laminated on the entire surface. To form a mini LOCOS oxide film 58 (given reference numeral 7 in the above-mentioned embodiment) which will be formed on the floating gate, the photoresist PR is patterned such that a portion of the polycrystalline silicon 56 corresponding to the mini LOCOS oxide film 58 is exposed. Then, the silicon nitride film 57 is opened through the photoresist PR. Then, P ions are implanted through the opening. The implanting conditions are such that the dose quantity is about $2.5\ \text{E}14/\text{cm}^2$ and the acceleration is 25 KeV. The foregoing impurities may be introduced before the silicon nitride film 57 is formed.

Figure 25:
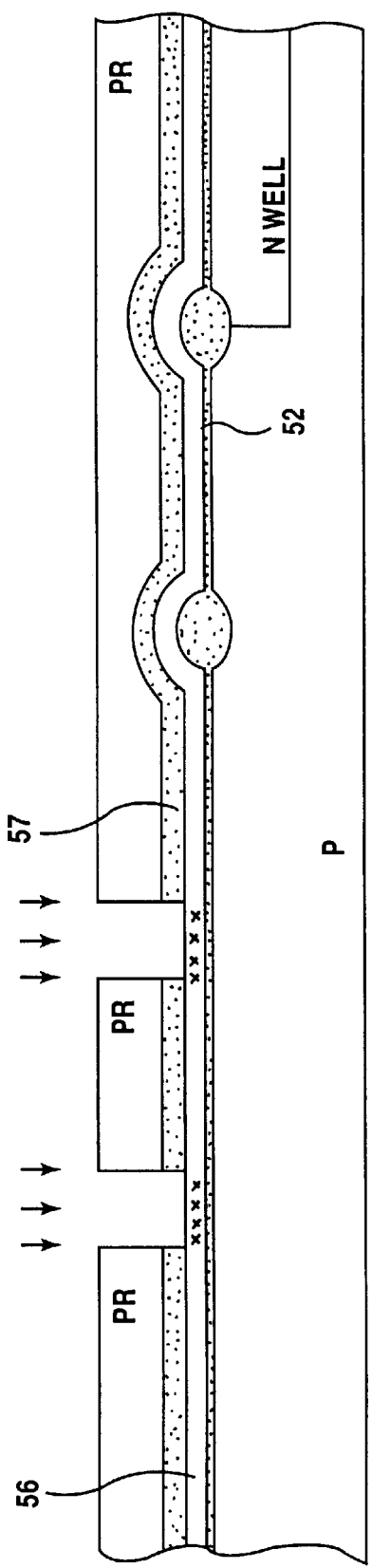
FIG. 25 is a cross sectional view showing a method of manufacturing a nonvolatile semiconductor memory device according to a fifth embodiment of the present invention.

The drawing shows the impurities injected into the foregoing region is indicated with xxx (see FIG. 25).

Then, the silicon nitride film 57 is used as a mask to selectively oxidize the polycrystalline silicon 56 exposed through the opening so that a mini LOCOS oxide film 58 (given reference numeral 7 in the above-mentioned embodiment) is formed.

Similarly to the above-mentioned embodiment, each of the both ends of the mini LOCOS oxide film 58 (7) is respectively disposed in the inclined portions of the first and second LOCOS oxide films 2A and 2B formed integrally with the LOCOS oxide film 55. Thus, the both ends can be sharpened as the corner B shown in FIG. 6.

Figure 26:
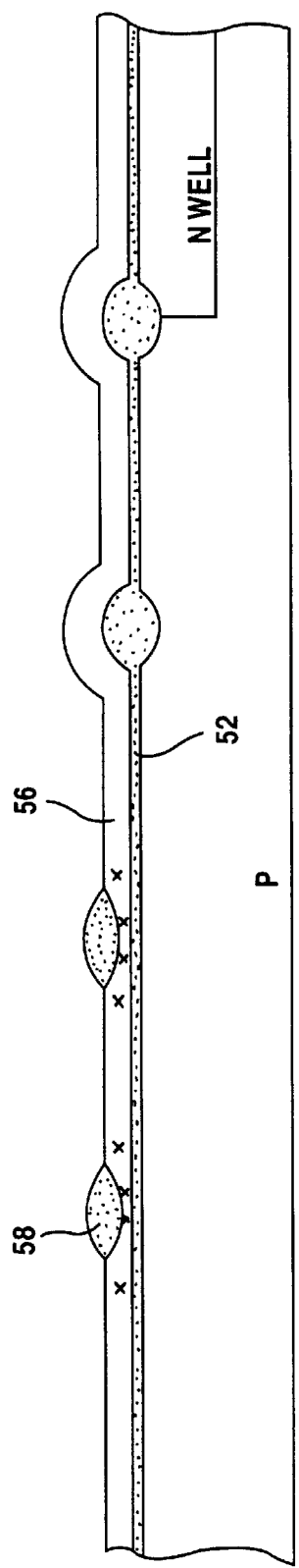
FIG. 26 is a cross sectional view showing a method of manufacturing a nonvolatile semiconductor memory device according to a fifth embodiment of the present invention.

Then, the silicon nitride film 57 is removed so that the polycrystalline silicon 56 having the mini LOCOS oxide film 58 is exposed (see FIG. 26).

Since the process for removing the silicon nitride film 57 is similar to that according to the above-mentioned embodiment, the foregoing process is omitted from description.

Then, the exposed mini LOCOS oxide film 58 is etched with buffered hydrofluoric acid ($HF:H_2O:NH_4F=1:40:20$) so that the upper surface of the mini LOCOS oxide film 58 is cut by a thickness of about 100 Å to about 300 Å.

That is, the upper surface is removed by the thickness of about 100 Å to about 300 Å so that the outer periphery of the mini LOCOS oxide film 58 is cut. As a result, jaggies of the shape of the second LOCOS oxide film 58 are removed so that the shape is made to be relatively smooth into a substantially elliptic shape.

A next process is performed such that the etched mini LOCOS oxide film 58 is used as a mask to etch the polycrystalline silicon 56 so as to form a floating gate 59 (given reference numeral 8 in the above-mentioned embodiment).

When the ECR etcher is employed, the following conditions are employed: $Cl_2$ gas at a flow rate of 80 sccm and $O_2$ gas at a flow rate of 5 sccm are employed, the pressure is 5 mTorr, the RF power is 50 W and a 250 mA magnetron is employed. Thus, the polycrystalline silicon 56 is etched and also the LOCOS oxide film 55 is exposed.

The shapes of the side walls of the thus-formed floating gate 59 are made such that the periphery of the mini LOCOS oxide film 58 has smooth surfaces. Since the LOCOS oxide film 58 is used as a mask when the etching process is performed, undesirable linear deformation can be prevented. Thus, a smooth shape can be realized. As described above, the corner B shown in FIG. 6 can be formed.

Figure 27:
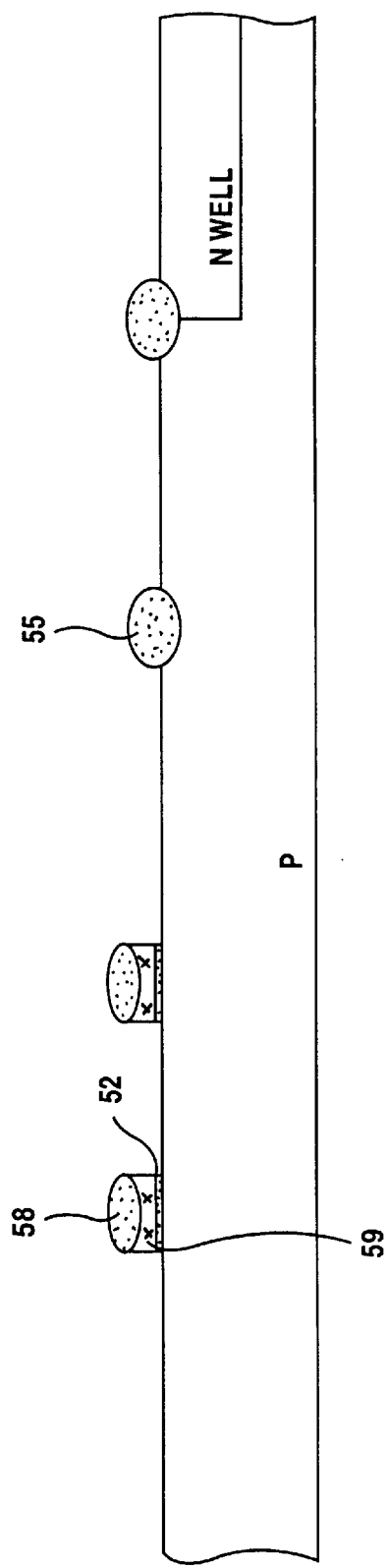
FIG. 27 is a cross sectional view showing a method of manufacturing a nonvolatile semiconductor memory device according to a fifth embodiment of the present invention.
Figure 28:
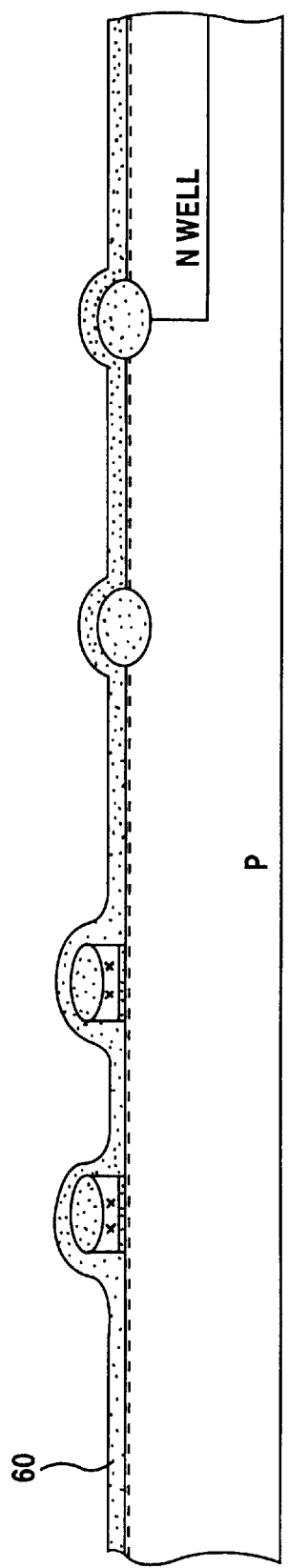
FIG. 28 is a cross sectional view showing a method of manufacturing a nonvolatile semiconductor memory device according to a fifth embodiment of the present invention.
Figure 29:
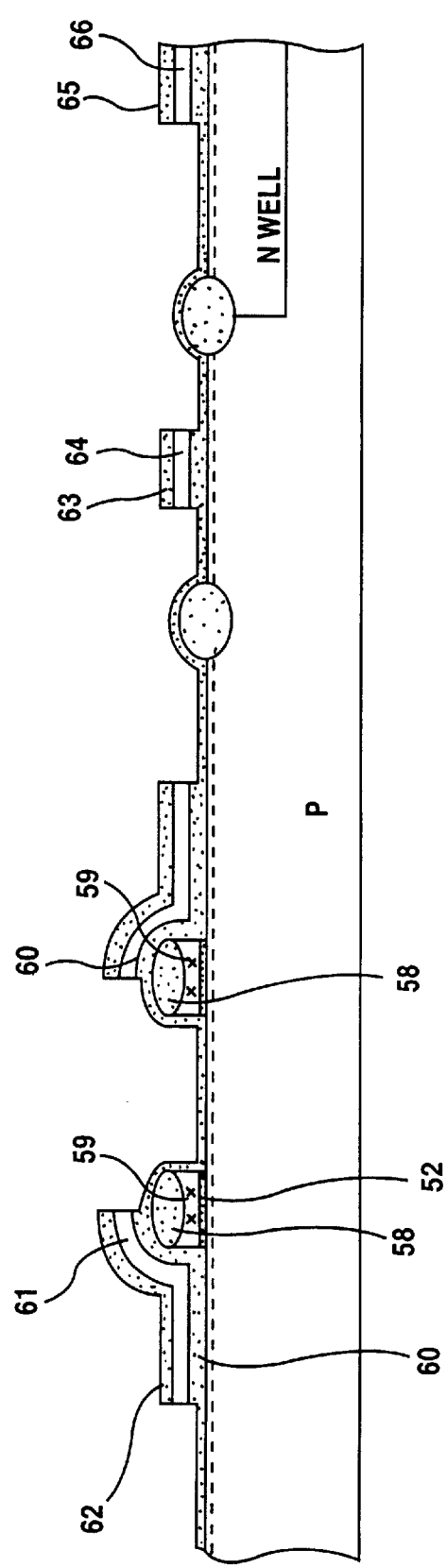
FIG. 29 is a cross sectional view showing a method of manufacturing a nonvolatile semiconductor memory device according to a fifth embodiment of the present invention.

Then, hydrofluoric acid (for example, $HF:H_2O=1:25$) is employed to etch the first gate insulating film of the insulating film 52 in a portion except for a portion directly below the floating gate 59 (see FIG. 27).

Then, a silicon oxide film having a thickness of about 150 Å is formed on the entire surface by CVD. Thus, a portion given reference numeral 60 (given reference numeral 10 in the above-mentioned embodiment) is formed which is formed between the LOCOS oxide film 58 and a control gate 61 which will be formed (see FIG. 28).

Then, $BF_2$ for adjusting the threshold voltage is implanted to active regions of the N channel TR and the P channel TR in a dose quantity of $1.6\ \text{E}12/\text{cm}^2$ and an acceleration of 90

KeV. Then, the insulating film in the foregoing active region is etched through a photoresist (not shown), and then a gate insulating film is again formed in the above-mentioned active region.

As a result of the oxidizing process, an insulating film X indicated with a dashed line shown in FIG. 4 is formed. That is, the gate insulating films of the N channel TR and the P channel TR are formed or the thicknesses are adjusted by oxidizing the floating gate 59 of the nonvolatile semiconductor memory device in a direction from a boundary between the second gate insulating film 60 and the floating gate 59 to the inside portion of the floating gate.

Then, the entire surface is covered with polycrystalline silicon having a thickness of about 1000 Å by a LPCVD method. Then, P ions are doped by a diffusion source POC 13 so that an insulating film 62 composed of a WSix film having a thickness of 1000 Å and a silicon oxide film is formed.

Then, the insulating film 62 and the control gate 61 are patterned so as to extend from the upper portion of the second gate insulating film 60 toward the side portion through the gate insulating film 60 by using a photoresist (not shown). Moreover, a gate oxide film 63 and a gate 64 of the N channel TR and a gate oxide film 65 and a gate 66 of the P channel TR are formed (see FIG. 29).

Then, the photoresist used in the previous process is removed, and then the photoresist PR is patterned in such a manner that the source region 67 (S) of the nonvolatile semiconductor memory device is exposed. Then, P ions are implanted in a dose quantity of about 5×E15/cm$^2$ and an acceleration of 60 KeV (see FIG. 30).

Figure 30:
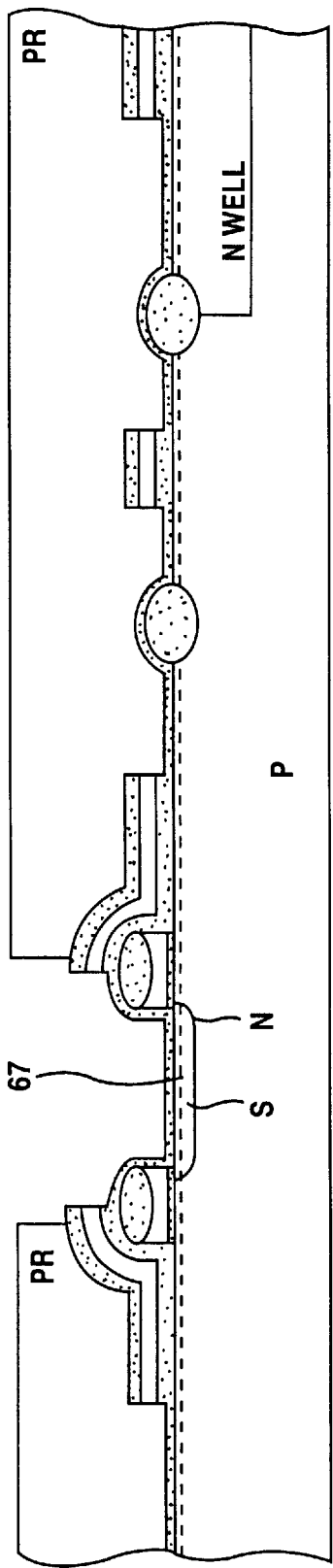
FIG. 30 is a cross sectional view showing a method of manufacturing a nonvolatile semiconductor memory device according to a fifth embodiment of the present invention.
Figure 31:
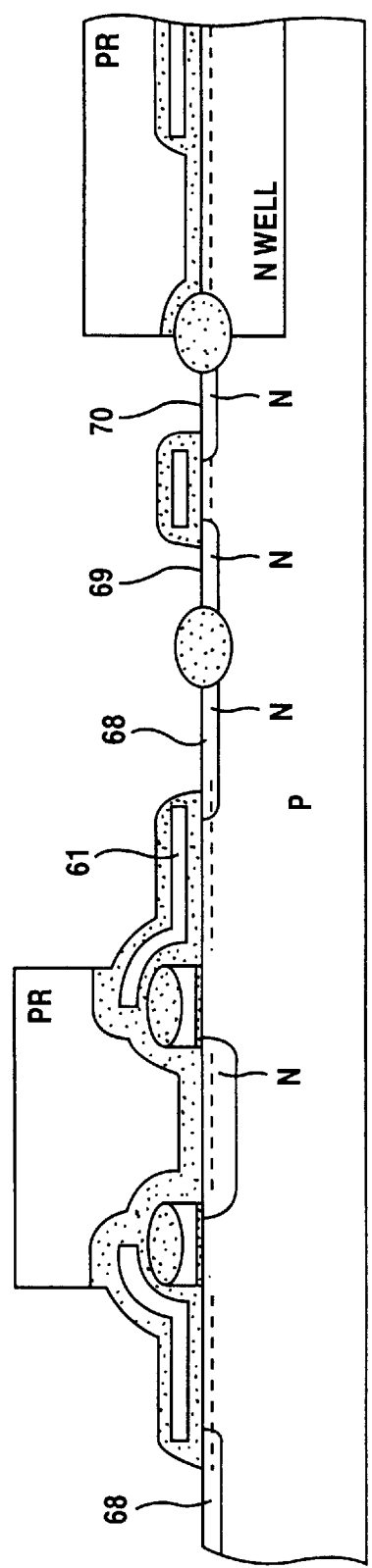
FIG. 31 is a cross sectional view showing a method of manufacturing a nonvolatile semiconductor memory device according to a fifth embodiment of the present invention.
Figure 32:
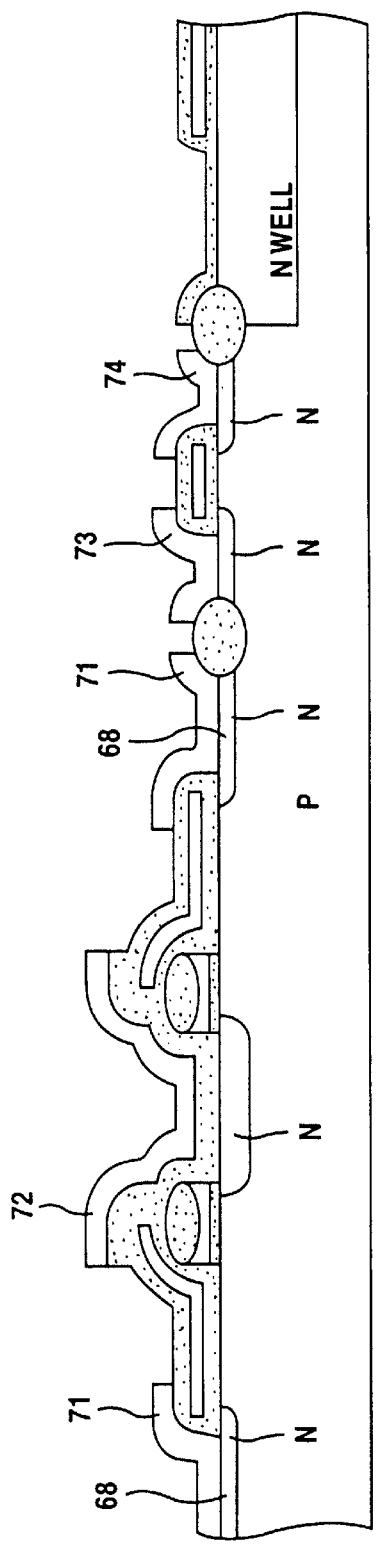
FIG. 32 is a cross sectional view showing a method of manufacturing a nonvolatile semiconductor memory device according to a fifth embodiment of the present invention.

Then, the photoresist PR used in the process shown in FIG. 30 is removed, and then a TEOS film having a thickness of about 1500 Å is formed. Then, isotropic dry etching is performed to provide a spacer for each of the control gate and gates of the N channel TR and the P channel TR. Then, photoresist (not shown) is used to implant P to a drain region 68 of the nonvolatile semiconductor memory device and source and drain regions 69 and 70 of the N channel TR which will be formed in a dose quantity of about 8×E13/cm$^2$ and an acceleration of 40 KeV.

Thus, the floating gate 59 and the control gate 61 serve as masks when impurities are implanted into the semiconductor substrate so that a split-gate-type flash memory having the source and drain regions is formed. Moreover, a source and a drain are formed adjacently such that the gate of the N channel TR is used as a mask (see FIG. 31). Then, polycrystalline silicon having a thickness of about 1000 Å is formed on the entire surface so that electrodes 71 to 74 are formed, as shown in the drawing (see FIG. 32).

Figure 33:
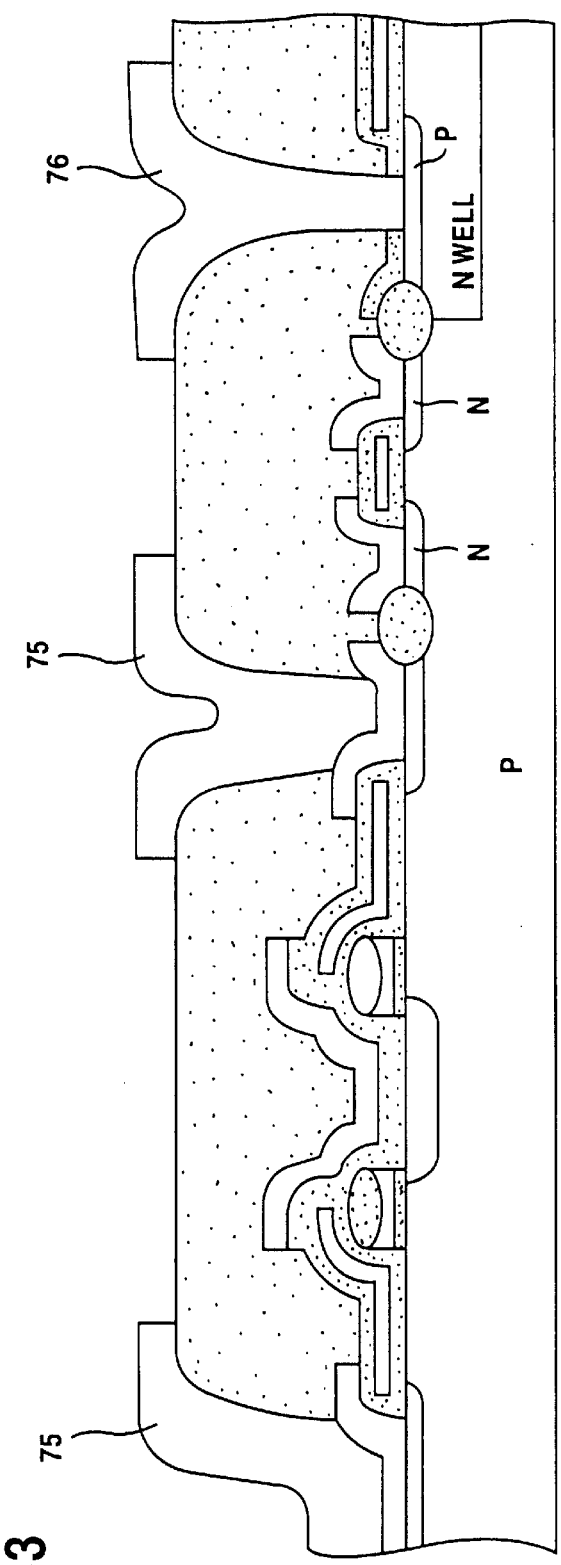
FIG. 33 is a cross sectional view showing a method of manufacturing a nonvolatile semiconductor memory device according to a fifth embodiment of the present invention.
Figure 34:
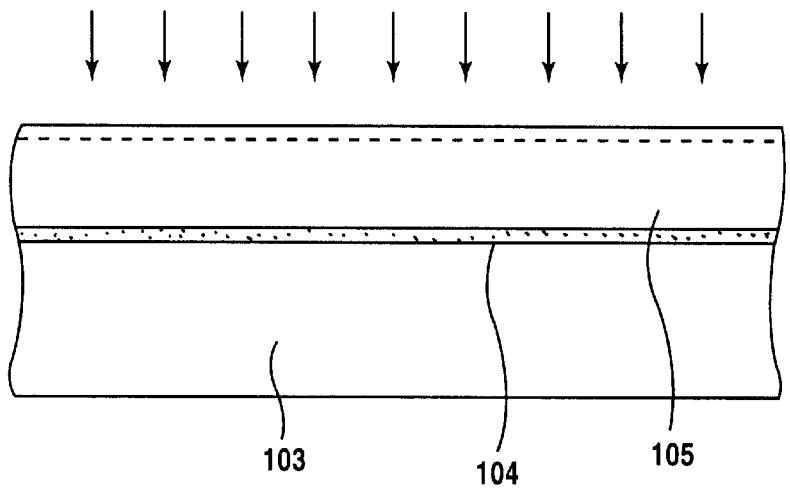
FIG. 34 is a cross sectional view showing a conventional method of manufacturing the nonvolatile semiconductor memory device.
Figure 35:
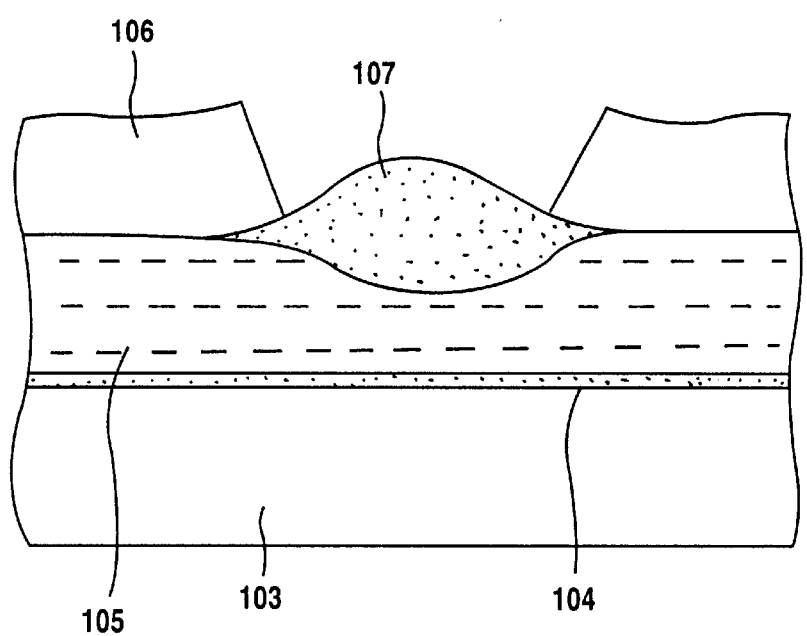
FIG. 35 is a cross sectional view showing a conventional method of manufacturing the nonvolatile semiconductor memory device.
Figure 36:
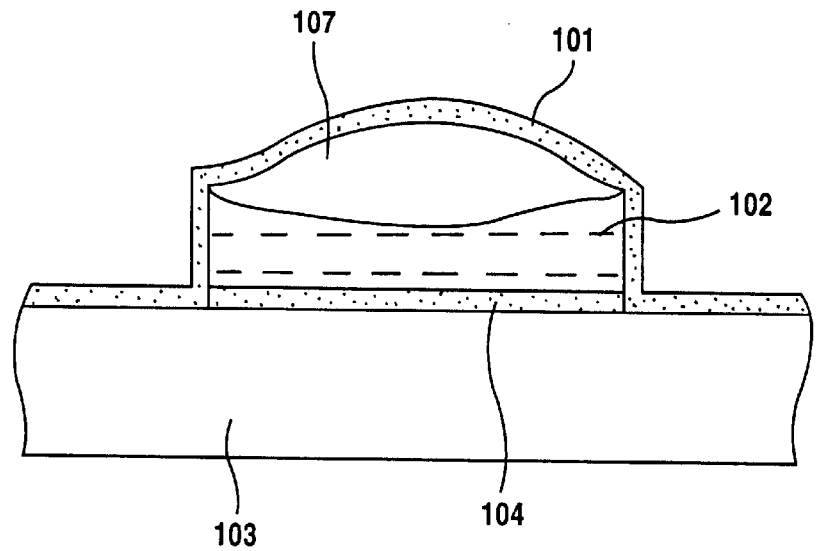
FIG. 36 is a cross sectional view showing a conventional method of manufacturing the nonvolatile semiconductor memory device.
Figure 37:
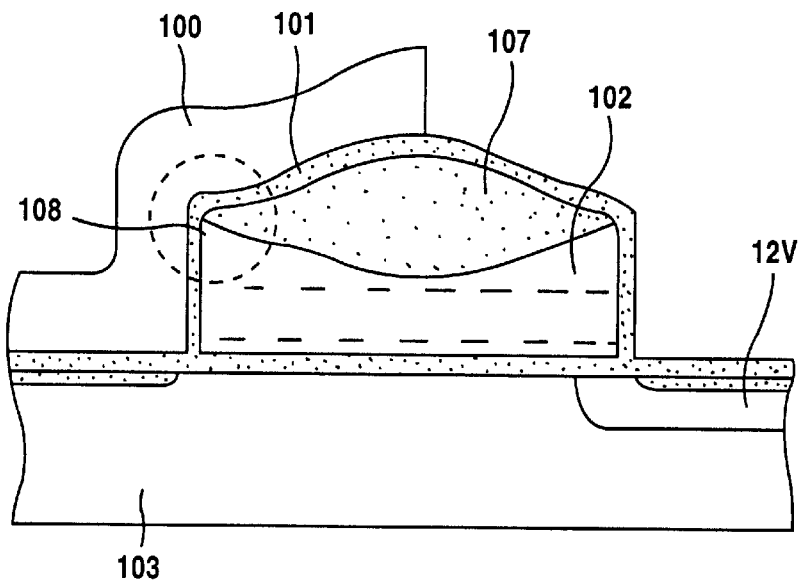
FIG. 37 is a cross sectional view showing a conventional method of manufacturing the nonvolatile semiconductor memory device.

Finally, a BPSG film having a thickness of about 2000 Å is formed on the entire surface, as shown in FIG. 33. Then, a flowing process is performed, and then a contact is opened in the BPSG film so that electrodes 75 and 76 are formed.

As can be understood from the foregoing description, the first feature has the structure that the end of the floating gate is disposed in the inclined portions of the bird's beaks of the first LOCOS oxide film and the second LOCOS oxide film so as to solve the problem. Thus, the projection of the floating gate can furthermore be sharpened, causing a tunnel current to easily flow from the floating gate to the control gate. Therefore, the number of rewriting times can be increased.

The second future has the structure that the end of the mini LOCOS oxide film is disposed in the inclined portions of the bird's beaks of the first LOCOS oxide film and the second LOCOS oxide film. Thus, the number of rewriting times can be increased similarly to the above-mentioned aspect.

The third future has the steps of:

forming an oxidation resistance film in the form such that a doped polycrystalline silicon film disposed between a first LOCOS oxide film and a second LOCOS oxide film is exposed and a mini LOCOS oxide film by oxidizing the doped polycrystalline silicon film through the oxidation resistance film; and forming a floating gate by etching the doped polycrystalline silicon film such that the mini LOCOS oxide film is used as a mask. Thus, the end of the floating gate can be sharpened.

That is, as shown in FIG. 1, the mini LOCOS oxide film is enlarged from the end of the oxidation resistance film. Therefore, when the oxidation resistance film in the form such that the doped polycrystalline silicon film is exposed is formed between the first LOCOS oxide film and the second LOCOS oxide film, the end of the mini LOCOS oxide film is formed in the inclined portion of the LOCOS oxide film. Thus, the end of the floating gate can furthermore be sharpened.

When the spacer for plugging the downward sharp portion formed by dint of the inclined portion is formed, the reverse tunneling phenomenon can be prevented. Therefore, injection of electrons from a corner of the control gate of a non-selected cell to the floating gate of the same can be prevented. Therefore, incorrect writing of a program can be prevented.

Since electric currents can uniformly be supplied from the projection of the floating gate at a position below the control gate, the lifetime of the device can be elongated.

What is claimed is:

1. A nonvolatile semiconductor memory device comprising:

a floating gate electrically independently disposed on a semiconductor substrate of a first conduction type;

a mini LOCOS oxide film formed on said floating gate;

an insulating film which covers said mini LOCOS oxide film and said floating gate;

a control gate formed on said insulating film so as to be overlaid on an end of said floating gate;

a drain region of a semiconductor region of a second-conduction-type opposite to the first conduction-type, formed in a surface of said semiconductor substrate adjacent to said floating gate; and a source region of a semiconductor region of a second-conduction-type opposite to the first conduction-type, formed in the surface of said semiconductor substrate adjacent to said control gate, wherein said semiconductor substrate has a recess incorporating an inclined portion, and at least a portion of an end of mini LOCOS oxide film facing to a lower portion of said control gate is located on the inclined portion.

2. A nonvolatile semiconductor memory device according to claim 1, further comprising:

first and second LOCOS oxide films which are elongated in a direction on said semiconductor substrate, which are formed apart from each other for a predetermined distance and each of which has a bird's beak, wherein said floating gate and said mini LOCOS oxide film extend on said first and second LOCOS oxide films, and ends of said floating gate and said mini LOCOS oxide film are disposed on inclined portions of the bird's beaks of said first and second LOCOS oxide films.

3. A nonvolatile semiconductor memory device according to claim 2, further comprising:

an acute angle portion downwards formed between an end of said floating gate and said first LOCOS oxide film or said second LOCOS oxide film; and a spacer embedded in said acute angle portion and made of an insulating material.

4. A nonvolatile semiconductor memory device according to claim 1, wherein said recess is as removed portion formed by removing said LOCOS oxide film, and said inclined portion is formed by removing the bird's beak of said LOCOS oxide film.

5. A nonvolatile semiconductor memory device according to claim 1, wherein said recess is formed by anisotropic etching, and said inclined portion is formed by isotropic etching.

6. A nonvolatile semiconductor memory device according to claim 1, further comprising:

first and second LOCOS oxide films which are elongated in a direction on said semiconductor substrate, which are formed apart from each other for a predetermined distance and each of which has a bird's beak, wherein either said first or second recess is formed on said semiconductor substrate between said first LOCOS oxide film and said second LOCOS oxide film.

* * * * *